US006293749B1

(12) United States Patent
Raaijmakers et al.

(10) Patent No.: US 6,293,749 B1
(45) Date of Patent: *Sep. 25, 2001

(54) SUBSTRATE TRANSFER SYSTEM FOR SEMICONDUCTOR PROCESSING EQUIPMENT

(75) Inventors: Ivo Raaijmakers, Phoenix; Loren R. Jacobs, Mesa; Michael W. Halpin, Phoenix; James A. Alexander, Tempe, all of AZ (US); Ken O'Neill, Winston-Salem, NC (US); Dennis L. Goodwin, Chandler, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/193,991

(22) Filed: Nov. 17, 1998

Related U.S. Application Data

(63) Continuation-in-part of application No. 08/976,537, filed on Nov. 21, 1997, now Pat. No. 6,068,441.

(51) Int. Cl.[7] .............................. B65G 49/07; H01L 21/68
(52) U.S. Cl. ..................... 414/609; 414/180; 414/785; 414/804; 414/941; 294/32; 294/902
(58) Field of Search .................................. 414/609, 180, 414/186, 785, 804, 805, 814, 935, 937, 941; 294/902, 1.1, 32

(56) References Cited

U.S. PATENT DOCUMENTS 3,708,851   1/1973   Vladik .
4,281,031   7/1981   Hillman et al. ...................... 438/759

(List continued on next page.)

FOREIGN PATENT DOCUMENTS

| 0 272 142 A2 | 6/1988 | (EP) . |
| 0 853 333 A1 | 7/1998 | (EP) . |
| 61-140432 | 6/1986 | (JP) . |
| 62-128539 | 6/1987 | (JP) . |
| 5-47899 | 2/1993 | (JP) . |
| 6-127621 | 5/1994 | (JP) . |
| 7-22489 | 1/1995 | (JP) . |
| 7-297262 | 11/1995 | (JP) . |

*Primary Examiner*—Robert P. Olszewski
*Assistant Examiner*—Gerald J. O'Connor
(74) *Attorney, Agent, or Firm*—Knobbe, Martens, Olson & Bear, LLP.

(57) ABSTRACT

A system for facilitating wafer transfer comprises a susceptor unit consisting of an inner susceptor section which rests within an outer susceptor section. A vertically movable and rotatable support spider located beneath the susceptor unit can rotate into positions to engage either the inner or the outer susceptor sections. When the inner section is engaged, the support spider lifts the inner section vertically out of the outer section. When the outer section is engaged, the support spider raises and lowers the entire susceptor unit. A robotic arm end effector engaging only the lower surface of the outer edge of the wafer permits hot wafer pick-up and unloading by the inner susceptor section. Several end effectors are disclosed that minimize non-uniform thermal effect on the substrate.

44 Claims, 14 Drawing Sheets

U.S. PATENT DOCUMENTS

| | | |
|---|---|---|
| 4,433,951 | 2/1984 | Koch et al. ............................ 414/217 |
| 4,565,601 | 1/1986 | Kakehi et al. . |
| 4,775,281 | 10/1988 | Prentakis . |
| 4,951,601 | 8/1990 | Maydan et al. . |
| 4,996,942 | 3/1991 | deBoer et al. ........................ 118/666 |
| 5,022,695 | 6/1991 | Ayers ..................................... 294/88 |
| 5,046,909 | 9/1991 | Murdoch . |
| 5,061,144 | 10/1991 | Akimoto et al. . |
| 5,096,291 | 3/1992 | Scott ..................................... 356/244 |
| 5,104,694 | 4/1992 | Saito et al. ............................ 427/255 |
| 5,135,635 | 8/1992 | Ikeda . |
| 5,421,893 | 6/1995 | Perlov ................................... 118/725 |
| 5,445,491 | 8/1995 | Nakagawa et al. ................... 414/805 |
| 5,518,542 | 5/1996 | Matsukawa et al. ................... 118/52 |
| 5,562,947 | 10/1996 | White et al. . |
| 5,584,936 | 12/1996 | Pickering et al. . |
| 5,643,366 | 7/1997 | Somekh et al. . |
| 5,692,873 | 12/1997 | Weeks et al. ......................... 414/627 |
| 5,700,046 | 12/1997 | Van Doren et al. ............... 294/119.1 |
| 5,746,460 | 5/1998 | Marohl et al. . |
| 5,765,889 | 6/1998 | Nam et al. ........................... 294/64.1 |
| 5,810,935 | 9/1998 | Lee et al. ............................. 118/728 |
| 6,068,441 * | 5/2000 | Raaijmakers et al. ............... 414/609 |

* cited by examiner

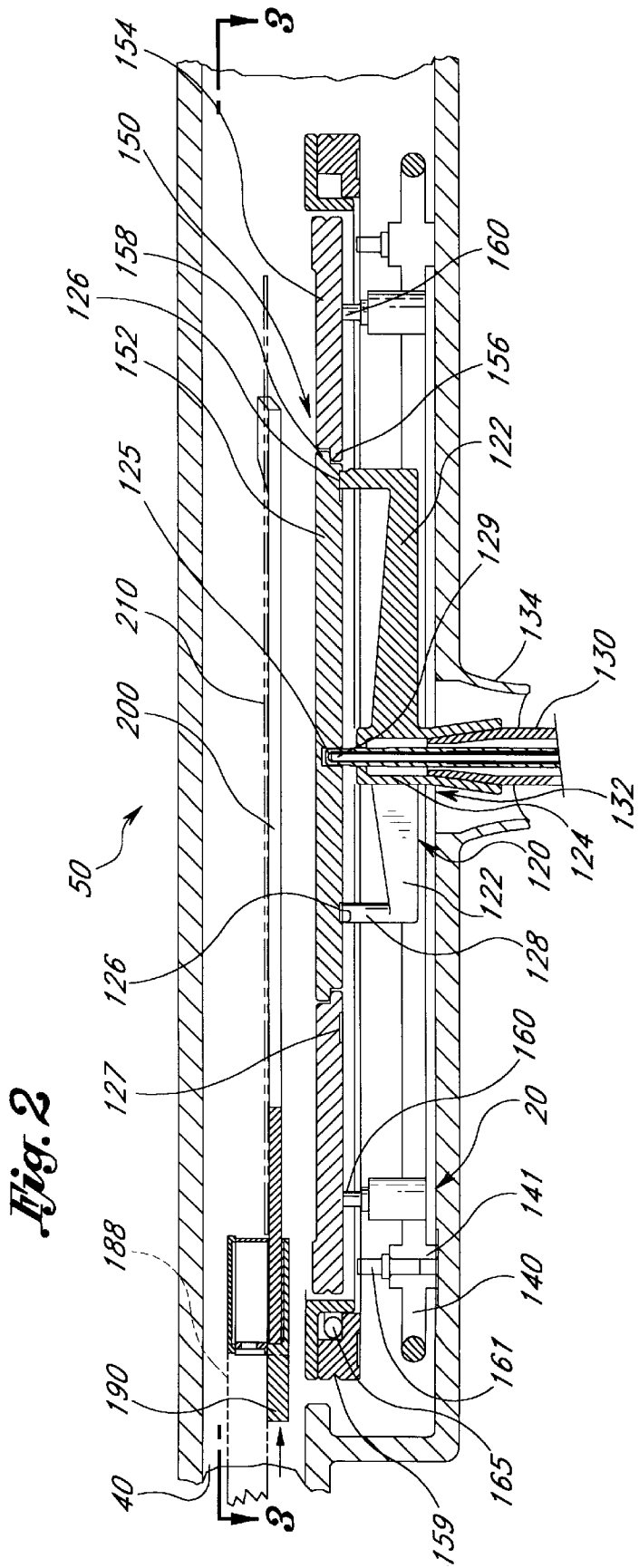

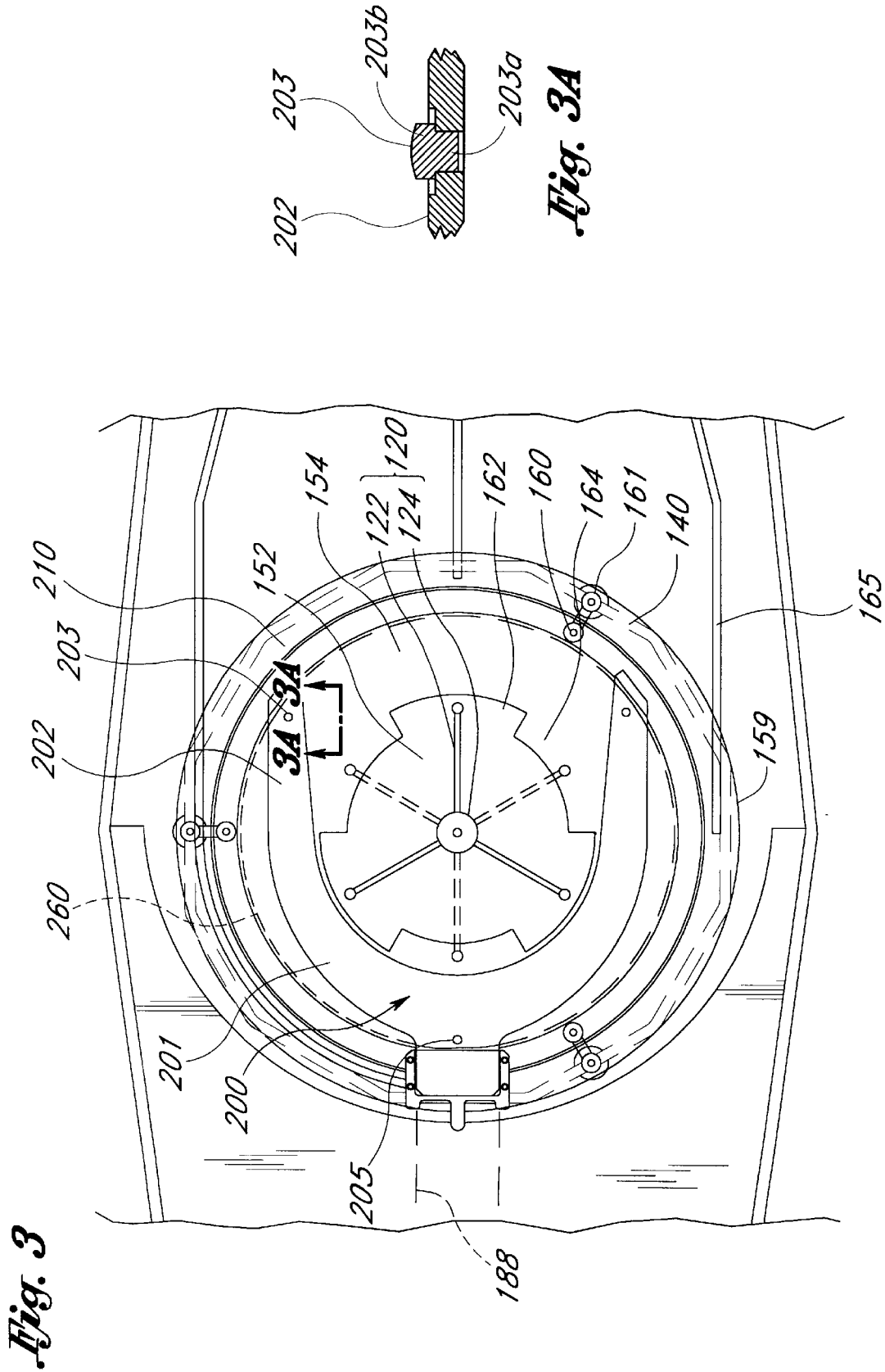

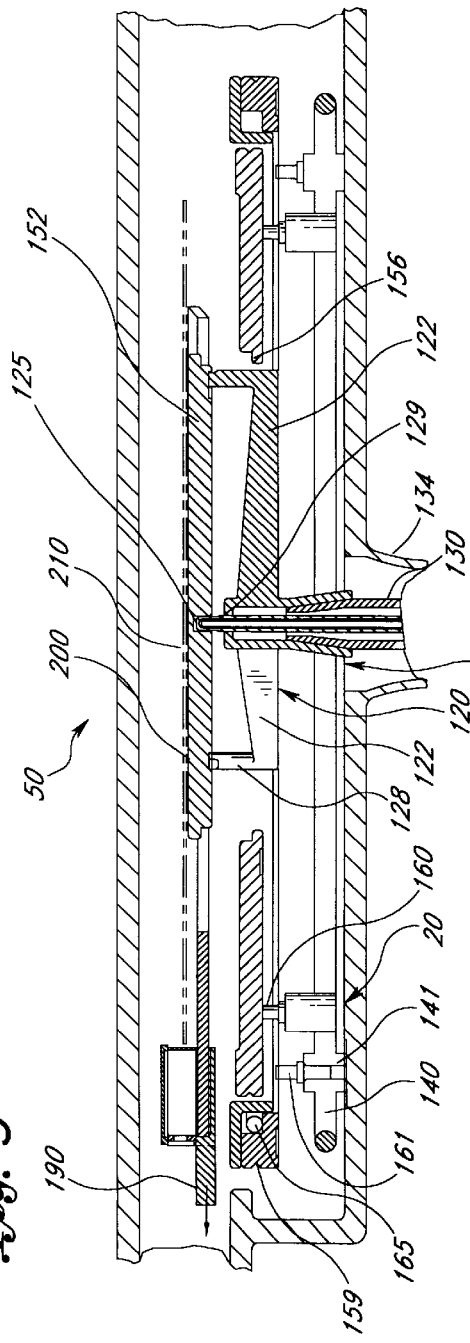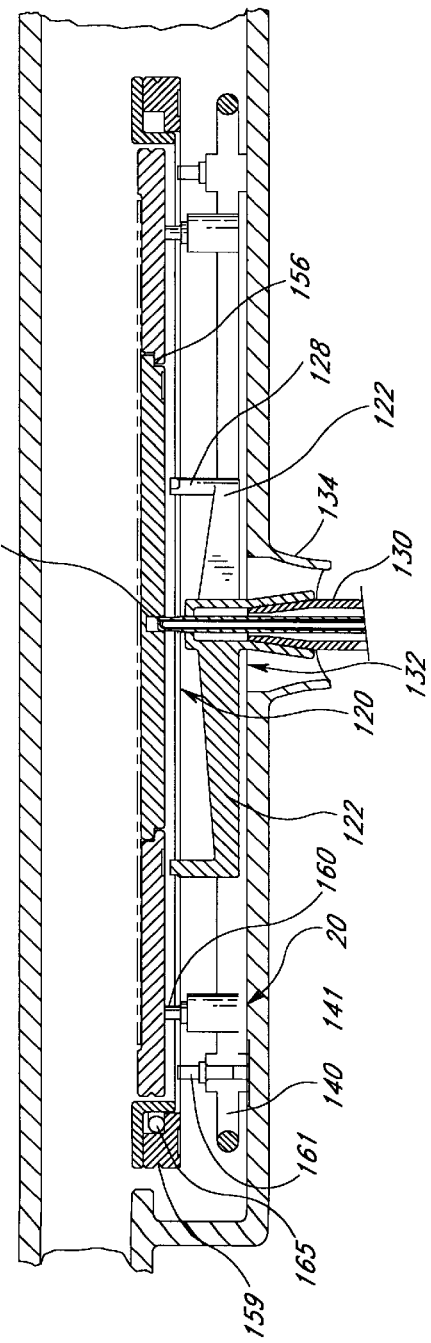

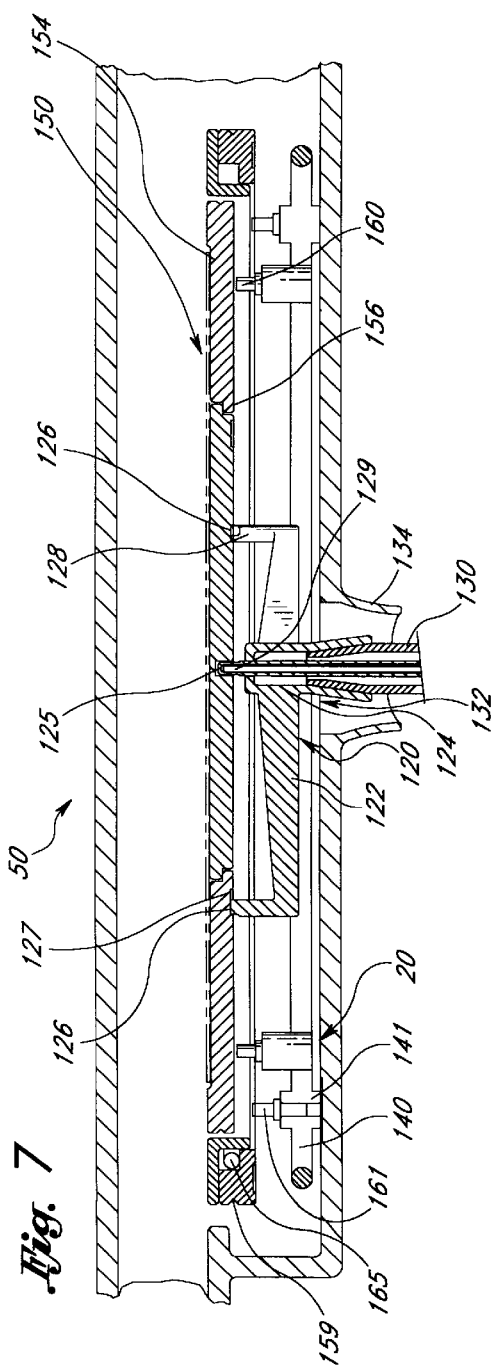
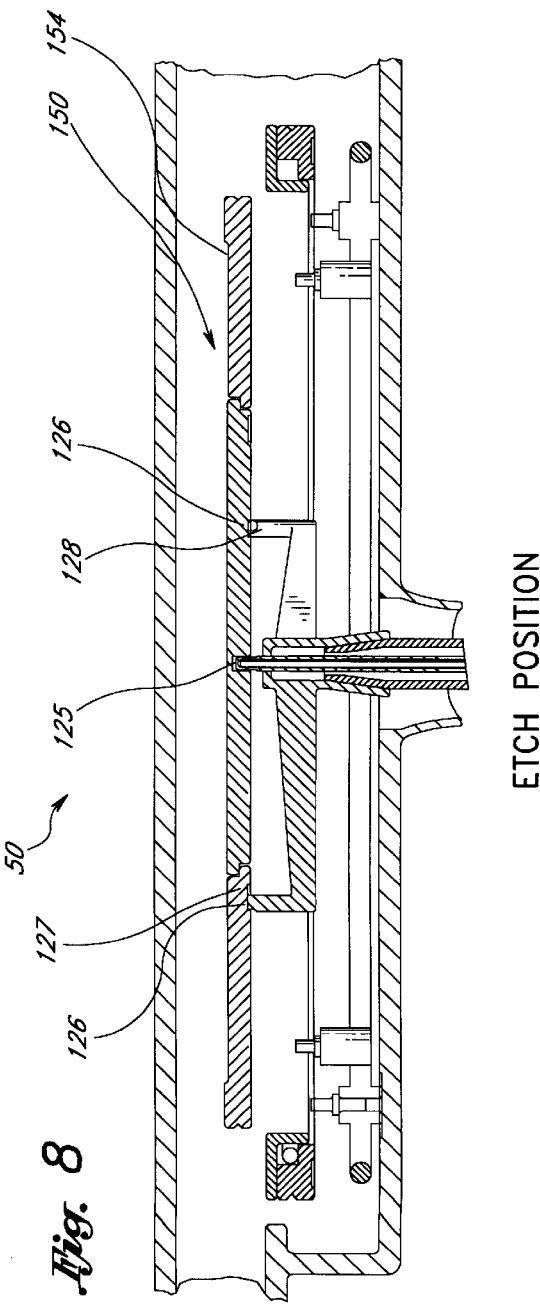

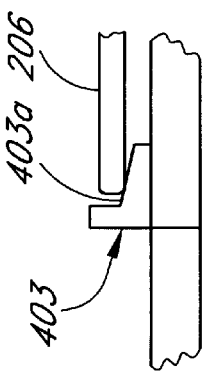
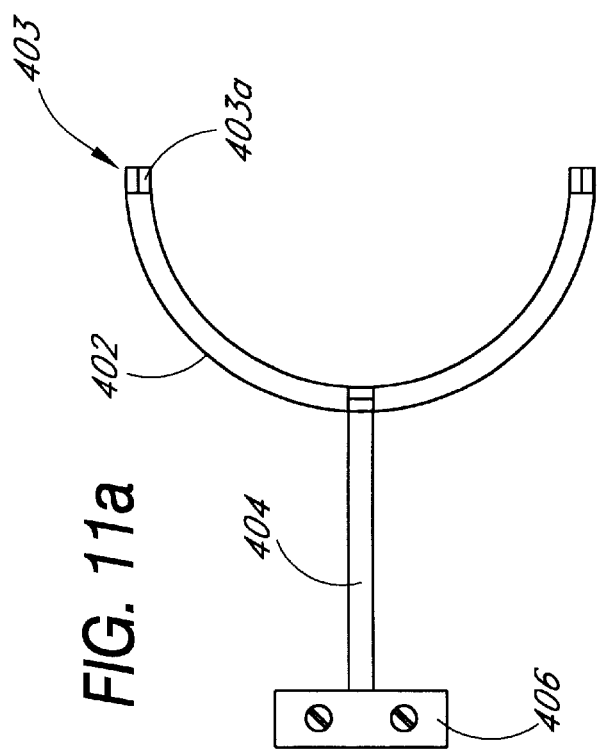
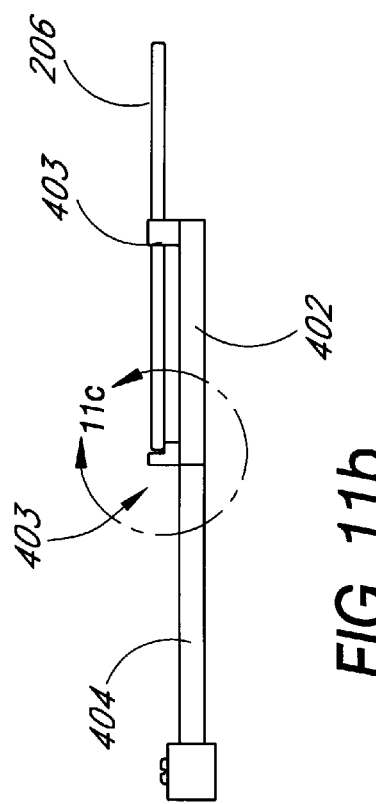

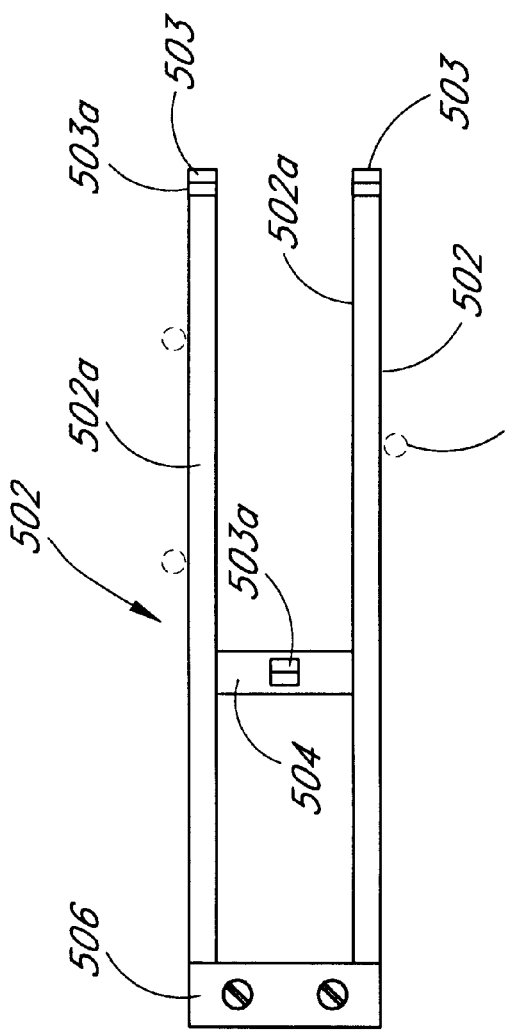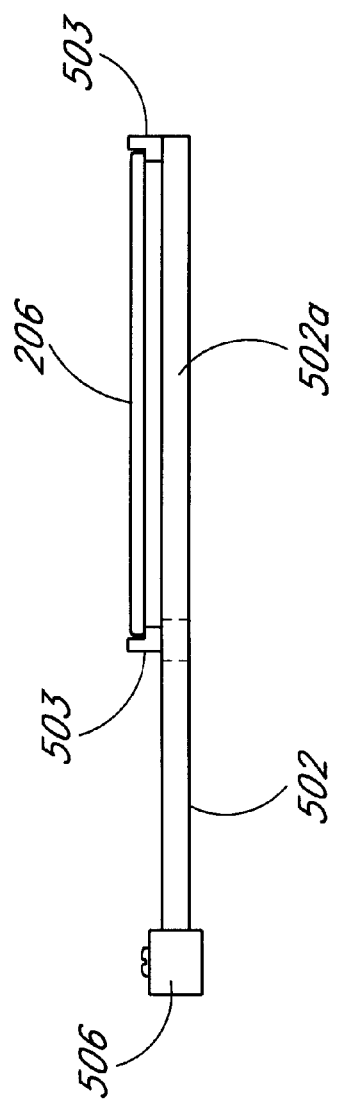
FIG. 12a
FIG. 12b

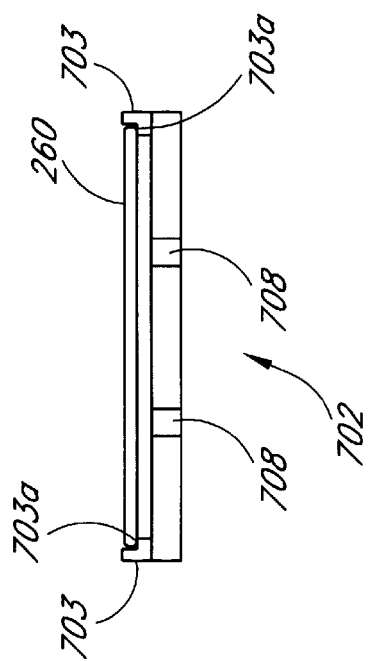
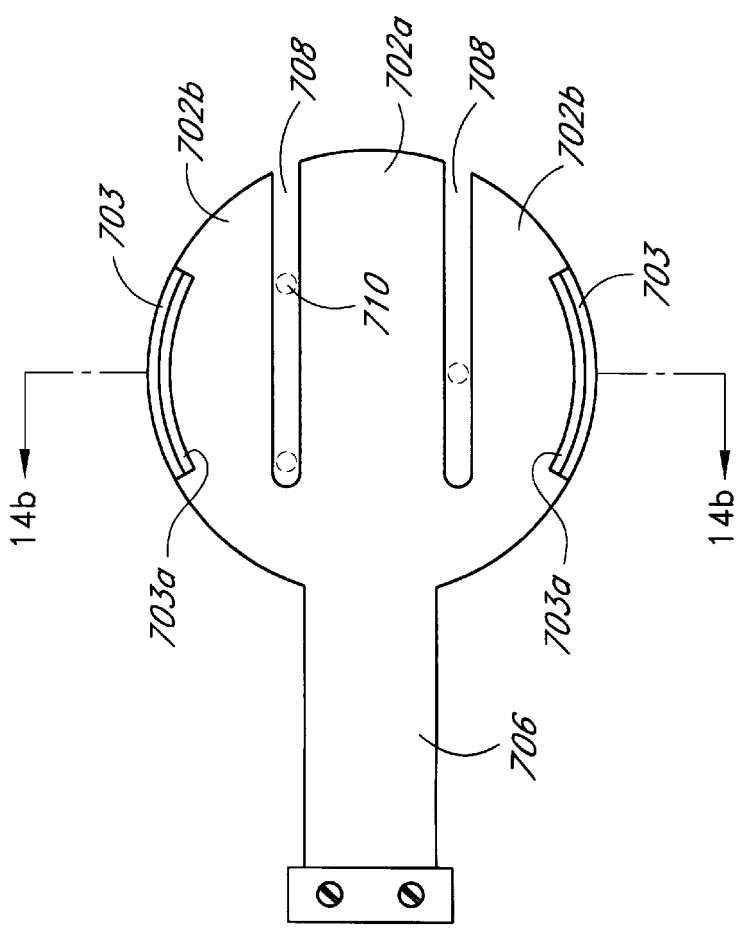
FIG. 14b
FIG. 14a

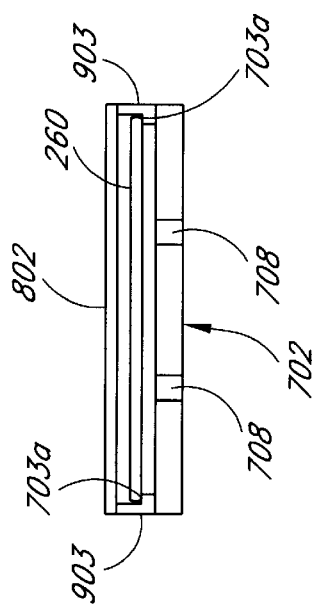
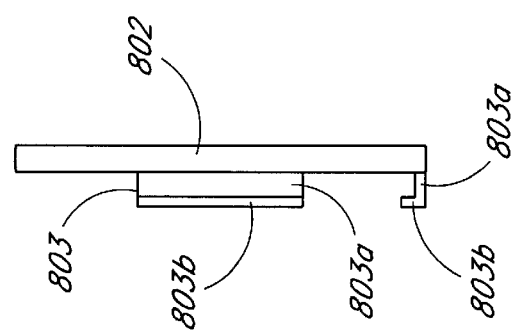
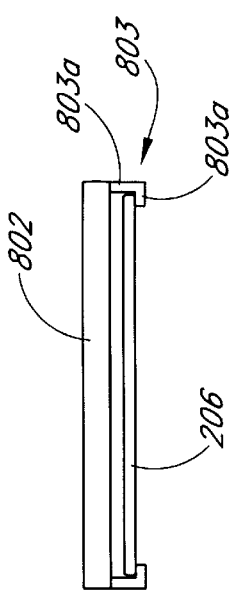
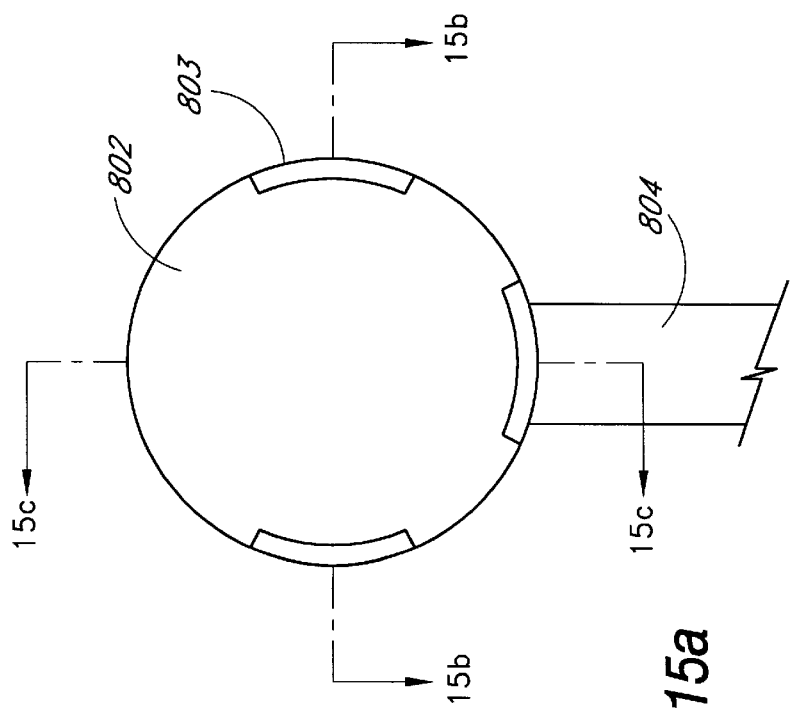

SUBSTRATE TRANSFER SYSTEM FOR SEMICONDUCTOR PROCESSING EQUIPMENT

RELATED APPLICATION

This invention is a continuation-in-part of U.S. application Ser. No. 08/976,537, filed Nov. 21, 1997 now Pat. No. 6,068,441.

BACKGROUND OF THE INVENTION

This invention relates to thermal reactors used in semiconductor wafer processing operations and, more particularly to a system for loading and unloading a wafer.

Semiconductor substrate, or wafers, are typically processed by chemical vapor deposition. Components included in semiconductor processing operations include a reaction chamber which is heated to a desired temperature and is configured to facilitate the controlled flow of a reactant gas, which contains the material to be deposited by thermal reaction onto a wafer. A base, which is commonly referred to in the art as a "susceptor," is usually provided in the reaction chamber for supporting the wafer during chemical vapor deposition. To facilitate automated processing, a robotic arm has been employed to place a wafer on a susceptor and subsequently, after processing, to remove it from the reactor.

Susceptors have evolved considerably during the last ten years, from simple flat platforms, which contributed nothing beyond their physical support to the processing operation, to susceptors provided with mechanisms for rotating the wafer during processing and sophisticated systems for sensing and responding to local temperature differences at the susceptor surface. Further, means for displacing the wafer from the susceptor after processing have been provided to assist in removal of the wafer by the robotic arm. Such innovations in susceptor design have contributed significantly to improved semiconductor quality and uniformity.

The means for facilitating wafer displacement from the susceptor surface and transfer to the robotic arm for removal from the reactor, remains problematic in automated semiconductor processing systems. One approach to wafer transfer operations, known in the art, involves using wafer support pins, which move vertically through holes in the susceptor to effect displacement of the wafer from the susceptor surface after processing.

The use of wafer support pins has several important shortcomings. Abrasion of the pins within the holes in the susceptor is caused both by the rotation of the susceptor as well as the different rates of thermal expansion exhibited by the pins and the susceptor. The abrasion results in particles which can contaminate the processing environment and compromise the quality of the processed semiconductor wafer. In addition to abrasion within the holes, marring of the backside of wafers has also been observed due to movement of the hot wafers while supported on the relatively sharp pins. A typical system utilizes a relatively large paddle on a robotic arm that extends beneath the central section of the wafer between the support pins. Such paddle which is colder than the wafer can also cause adverse effects on a hot wafer. The longer cool down periods for the wafer required to prevent such wafer damage tends to reduce reactor throughput.

A further problem associated with the use of wafer support pins is the permeation of processing gases through spaces that necessarily exist between the pins and the holes in the susceptor. As a result, the processing gases may deposit on the backsides of the wafers. Moreover, the presence of holes in the susceptor results in temperature non-uniformity both in the susceptor and in the wafer being supported thereon.

One approach taken to improve the pin-based wafer transfer operation is disclosed by U.S. Pat. No. 5,421,893 to Perlov. In that invention, the wafer displacement mechanism employs wafer support pins which are suspended from the susceptor. The use of freely suspended pins, as opposed to earlier pins, which were connected with both the vertical and rotational drive mechanisms, is intended to reduce pin abrasion within the holes in the susceptor during rotation. Further, the Perlov support pins have enlarged frusto-conical heads which fit into complementary depressions countersunk in the upper surface of the susceptor, providing a flat support surface and a sealing means for decreasing the permeation of processing gases to wafer backsides.

Notwithstanding the improvements related to diminished rotational abrasion and backside deposition, Perlov still employs a susceptor with a plurality of holes, which are likely, in view of the prior art, to cause temperature non-uniformities. In addition, contaminating particles are still likely to be generated by abrasion when the support pins slide vertically within the susceptor holes. Finally, shrinking of the hot wafer on support pins may still result in backside scratching. Thus, Perlov fails to resolve several of the most important problems inherent in the use of support pins as a means of separating the processed wafer from the susceptor.

Another approach to wafer transport is disclosed in U.S. Pat. No. 5,080,549 to Goodwin, et al. That invention relates to a wafer handling system which utilizes the Bernoulli Principle to effect contactless pick up of the wafer. Specifically, a robotic arm is adapted to include a plurality of gas outlets in the bottom plate of a pick up wand. The gas outlets radiate outward from a central portion of the wand in such a pattern as to produce an outward flow of gas across the top surface of the wafer. The gas flow creates an area of relatively low pressure between the top surface of the wafer and the bottom surface of the pick up wand, resulting in wafer pick up without physical contact. While the Bernoulli wand addresses all of the major shortcomings associated with pin-based wafer transfer mechanisms and has some other advantages, it presents a different problem. In order to provide adequate gas flow, the robot arm and pick up wand assembly are too thick to fit between the unprocessed wafers in a standard wafer supply cassette. Also, if inappropriately operated in a "dirty" reactor, the gas flow from the wand can stir up particles which settle on the wafer surface. It is also desirable to provide a susceptor and end effector system that avoids problems of known systems but enables a hot wafer to be picked up from below without adverse temperature effects on the wafer, so as to obtain high product throughout.

Therefore, the need exists for a mechanism which facilitates wafer loading from standard cassettes as well as unloading from a susceptor without using wafer support pins, thereby reducing particle contamination within the reactor, temperature non-uniformities, and backside damage during hot pick-up.

SUMMARY OF THE INVENTION

A system for facilitating wafer transfer disclosed by the present invention includes a susceptor unit formed by separate sections. The sections are vertically and rotatably coupled to move as a single unit in a wafer processing or susceptor etch position. A rotatable support, such as multi-arm spider, rotates and supports one of the sections, which, in turn, rotates and supports the other section. The susceptor sections are also vertically movable relative to each other to cooperate with a wafer handling tool in a wafer load/unload position. The system further includes a second support for the susceptor sections, the two supports being vertically and rotatably movable relative to each other.

In one form of the susceptor unit, the inner and outer sections include a plurality of radially-oriented tabs and recesses which interlock to form the single susceptor unit. Further, the inner and outer sections are fashioned with offsetting marginal flanges to provide vertical support for the inner section within the outer section, thereby creating a substantially flat upper surface for receiving a wafer. In one form of the susceptor unit, the interlocking structure is beneath this upper surface and the interface between the two sections on the upper surface is circular.

In one form of the invention, the multi-arm spider located beneath the susceptor unit can rotate into positions to engage recesses of either the inner or the outer susceptor sections. When the inner section is engaged, the support spider can lift the inner section vertically out of the outer section. When the outer section is engaged, the spider can raise or lower the entire susceptor unit, as well as rotate it.

To facilitate wafer loading and unloading, a wafer is moved horizontally into a position in the reaction chamber directly over the susceptor by a robotic arm. An end effector is employed that minimizes temperature non-uniformities in the wafer, while at the same time permitting high temperature pick-up of a wafer. This is accomplished utilizing an end effector that engages the lower side of the wafer and will fit within a standard cassette. In one embodiment, the wafer is supported by a fork-type end effector on the robot arm having three pins that only engage radially outer portions of the wafer, and thus only minimally effects the temperature of the wafer, and then only at peripheral points.

The spider, engaging only the inner susceptor section, raises the inner section, meeting the wafer cradled within the end effector and lifting it out of the end effector. Alternatively, the inner section could be raised a certain distance, and the end effector could then be lowered to place the wafer on the susceptor section. The robotic arm can then be withdrawn and the inner susceptor, together with the wafer, lowered into the outer susceptor, which is supported by the outer susceptor support. The support spider continues traveling downward leaving the wafer resting on the complete susceptor unit. Alternatively, the outer support could be raised to separate the susceptor from the spider. After disengaging from the inner section, the spider rotates to a second position which will engage the outer susceptor. The appropriate relative vertical movement of the supports, such as the spider, can move the susceptor unit and the wafer to the processing position.

After processing the wafer, the susceptor unit may be lowered onto the outer susceptor supports, allowing the spider to be rotated to engage the inner susceptor section again, and the inner section together with the processed wafer are raised. To effect removal of the processed wafer, the robotic arm once again moves horizontally into the reaction chamber. When the end effector is in position between the inner and outer susceptor sections, relative movement between the inner section and the end effector is provided such as by lowering the inner section through the open end effector, which receives the wafer and then withdraws from the chamber.

After removal of the wafer, the spider may be once more manipulated to lower the inner section into the outer section, moved further lower, and rotated to a position beneath the outer section. The entire unit can then be raised above the process position for an etching treatment. This allows etching of the back side of the susceptor, as well as the top side.

By substituting a separate, vertically movable inner susceptor section for the several support pins used to displace the wafer from the susceptor unit in prior wafer transfer systems, the present invention addresses each of the major problems identified in the earlier approaches. First, the movement of the inner susceptor section within the outer section produces minimal abrasion because the vertical distance traveled during which the two sections are in physical contact is only equal to the thickness of the susceptor sections. In contrast, support pins are moving in contact with the susceptor body for the entire vertical rise necessary for providing access to the robotic arm. Moreover, there is no significant abrasion in the present invention due to differences in thermal expansion rates between the inner and outer susceptor sections, because both susceptor sections are constructed out of the same material. Second, backside deposits and temperature non-uniformity are minimized by the overlapping flanges, which provide, in addition to vertical support for the inner section, an effective seal against permeation of reactant gases and more uniform heat transfer. Finally, because the wafer rests on the inner susceptor surface throughout transport and processing, there is little possibility for marring during hot pick up. Thus, the present invention facilitates automated loading and unloading of semiconductor substrates, while avoiding shortcomings inherent in support pin-mediated transfer mechanisms.

The forked-type end effector mentioned above is in the form of a thin, flat U-shaped member with three pins or protrusions extending upwardly from the flat portion. Only the pins engage the wafer and hence the remainder of the U-shaped member does not significantly affect the temperature uniformity of the wafer. In another form, the end effector still has somewhat of a U-shape, although it is more preferably semicircular. That end effector is formed of quartz tubing or other suitable material, and preferably has a tubular handle or stem to be connected to a robotic arm. Three small pins or support elements are secured to the upper side of the tubular support. One element is located at each end of the support and a third is positioned in the middle of the support at the junction between the curved portion and the stem. Preferably, the elements have a stepped upper surface that helps position a wafer on those elements.

In another approach, the end effector is in the form of two spaced, generally parallel tubes having wafer support elements on their tips. A third wafer support element is supported on a cross piece having its ends joined to the other support tubes. The forward portions of the end effector tubes extend beneath a wafer. Support elements on the tube tips engage the wafer at an edge remote from the robotic arm supporting the end effector. A third support element is employed on the cross piece on the opposite side of the wafer from the other two. The tubes are spaced so that they can straddle a centrally located wafer support. Further, the tubes are spaced sufficiently close to each other that the pair can extend between wafer transfer mechanisms utilizing three support pins, as mentioned above in connection with the Perlov patent. Although the tubes extend beneath the wafer, they are spaced from the wafer so as to minimize any temperature effect on the wafer. Further, the fact that the tubing has low mass and is preferably made of quartz minimizes any effect of the tubing on the wafer temperature.

In yet another approach, a flat, generally rectangular paddle is employed that will extend beneath a wafer, the paddle being intended for use with a pin support system. The paddle is provided with three support elements that are taller than the elements used in the previously described embodiment. With that arrangement, the temperature effect of the paddle on the wafer is minimized because it is spaced from the wafer by the taller elements.

In two other arrangements, an end effector is provided that includes a disc positioned close to the wafer; but since the mass extends over most of the wafer surface, the temperature effect on the wafer is relatively uniform. Further, such arrangements have the advantage of producing uniform cooling of the wafer.

In one such form, the end effector has a disc-shaped upper portion with a diameter slightly larger than that of a wafer to be lifted. Three wafer support elements depend from the lower surface of the disc. Two of these elements are located on the sides of the disc, and a third element is centrally located between the two side ones at the junction between the circular element and a supporting stem for connection to the end effector. The side elements are spaced sufficiently to enable the end effector to move horizontally over the upper surface of the wafer with the side support elements straddling the wafer. Each support element has an inwardly extending foot or ledge which engages the underside of the wafer. Thus, a wafer is only supported at three locations on its periphery so as to have a minimum effect on the temperature of the wafer in those locations, and yet the entire wafer is uniformly affected by the disc. This end effector may be used with the two-piece susceptor described in this application or with a one-piece susceptor utilizing other arrangements for lifting a wafer above the susceptor, such as the three pin arrangement mentioned above.

In another form of the disc type, end effector specifically designed for use with the three pin lifters for raising a wafer above a susceptor, a circular disc is provided with two spaced elongated slots that are open to the forward edge of the disc. This creates a three-pronged paddle with the slots spaced so that the paddle can be moved beneath a wafer supported by three pins. Two of the pins may be received in one of the slots while a third is received in the other slot, and the central portion of the end effector paddle extends between the wafer lifter pins. Two or more wafer support elements are positioned on the periphery of the paddle to support the wafer. Thus, a paddle cooler than the wafer produces a relatively uniform cooling of the wafer.

In yet another arrangement, the three-pronged paddle can be combined with a disc spaced above the paddle. This forms a pocket which advantageously uniformly cools the wafer during pickup.

All of the end effector variations provide the advantage of being able to pick up a wafer at a relatively hot temperature, such as 700°–1000° C., while not causing significant adverse temperature effects on the wafer.

BRIEF DESCRIPTION OF THE DRAWINGS

FIG. 2 is an enlarged cross-sectional view of the reaction chamber, described by line 2 of FIG. 1, showing the inner and outer sections which comprise the susceptor unit, the support spider, and a wafer supported by the end effector.

FIG. 3 is a top view from 3—3 in FIG. 2, showing the wafer transfer and support mechanisms within the reaction chamber.

FIG. 3A is a cross-sectional view on line 3A—3A of FIG. 3 showing the detail of a preferred wafer support on the end effector.

FIG. 5 is a cross-sectional view of the reaction chamber showing the wafer transfer mechanism, wherein the inner susceptor section is shown lifting the wafer off the robotic arm end effector.

FIG. 6 is a cross-sectional view of the reaction chamber showing the wafer transfer mechanism, wherein the inner section has been lowered into the outer section to form a complete susceptor unit upon which the wafer is supported.

FIG. 7 is a cross-sectional view of the reaction chamber showing the wafer transfer mechanism, wherein the susceptor unit has been raised into position for wafer processing.

FIG. 8 is a cross-sectional view, showing the susceptor unit raised into an upper position for cleaning.

FIGS. 11–16 schematically show plan and side elevational views of six alternate end effectors.

DETAILED DESCRIPTION OF THE PREFERRED EMBODIMENT

Figure 1:
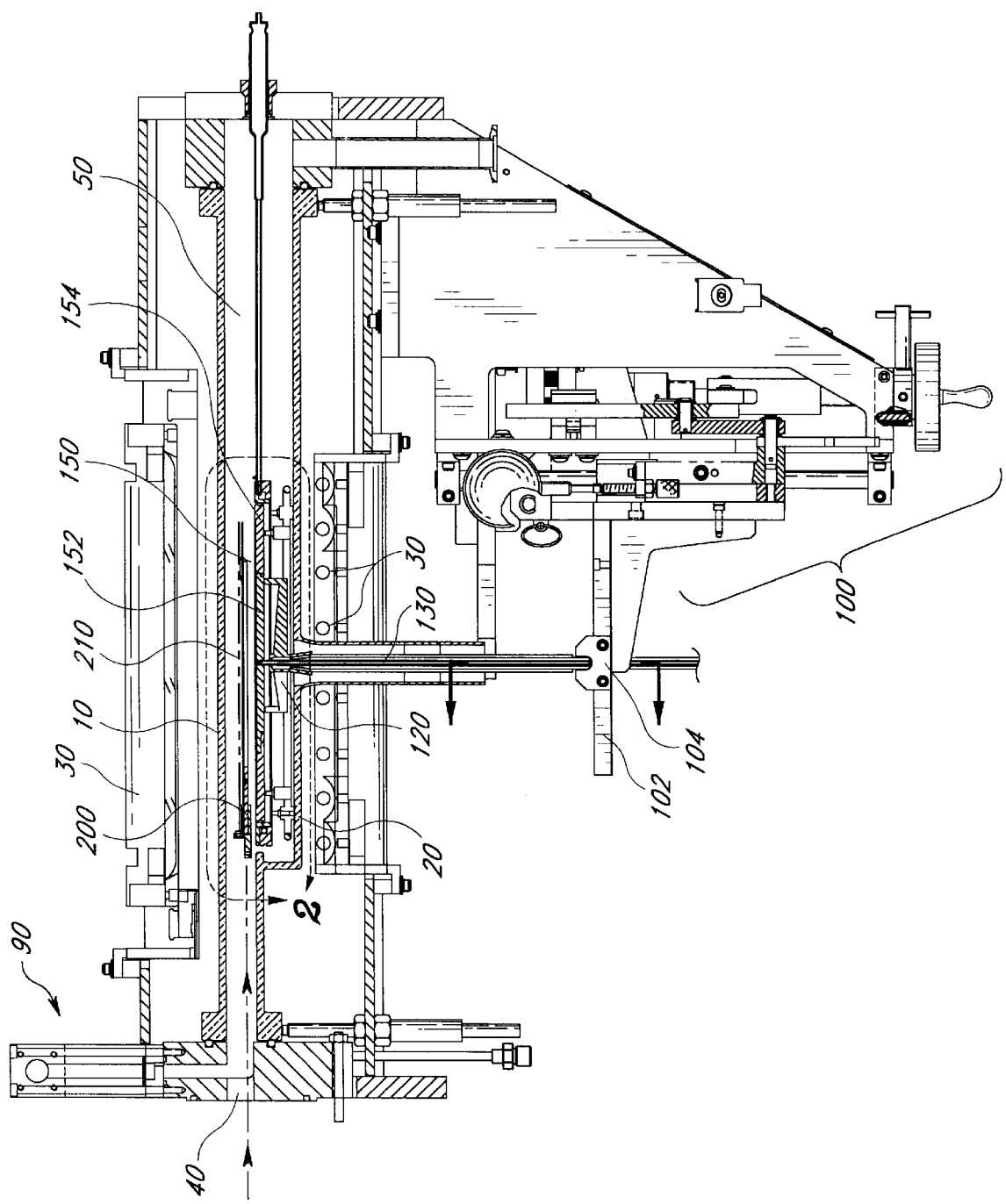
FIG. 1 is a cross-sectional view showing the overall assembled system.

Referring first to FIG. 1, the overall system of the present invention is shown, having a susceptor lift assembly 100 for generating vertical movement in the susceptor unit 150. The susceptor unit comprises an inner 152 and outer 154 section. The vertical movement generated within the susceptor lift assembly 100 is transferred to a mounting plate 102 which communicates with a drive shaft 130 via a coupling assembly 104 attached to the mounting plate and other components not shown. The vertically movable drive shaft also enables rotational movement of the susceptor unit. A support spider 120, coupled to the upper end of the drive shaft 130, is capable of selectively engaging either the inner or outer susceptor sections, 152 and 154, respectively. Thus, the support spider 120 directly provides both vertical support as well as rotational movement for the susceptor unit. A robotic arm end effector 200 is employed for loading and unloading wafers from the reaction chamber 50; a wafer 210 is shown resting on the end effector. The susceptor unit 150 and support spider 120 are described in greater detail below.

The overall system incorporates a number of elements, known in the field of semiconductor reactors, which are also illustrated in FIG. 1. These include upper and lower walls 10 and 20, respectively, of a quartz chamber, upper and lower radiant heating lamps 30, and a robotic arm access port 40. A group of spaced lamps 30 are positioned below the quartz chamber to heat the susceptor unit 150, and a group of such lamps are positioned above the quartz chamber extending perpendicular to the lamps below the chamber. During processing, the lamps are controlled to maintain the temperature of the susceptor unit substantially the same as the temperature of a substrate mounted on the unit. Reactant gases are introduced into the reaction chamber 50, via a gas injector system 90. As is known, both horizontal (as shown in FIG. 1) and axial reaction chambers may be employed in various configurations; the horizontal configuration illustrated is intended only as a typical, schematic representation of such chambers.

FIG. 2 shows the reaction chamber 50 in greater detail. From this cross-sectional view it can be seen that the susceptor unit 150 comprises two sections, an inner section 152 and an annular outer section 154, which both surrounds and provides vertical support for the inner section. This vertical support consists of offsetting, complementary flanges. The outer section protrudes radially inward along its lower inside margin to provide a supportive flange 156, whereas the inner section protrudes radially outward along its upper circumferential margin to provide a complementary inner section flange 158, which overhangs the outer section flange 156. When the susceptor unit is in its lowest position, as illustrated in FIG. 2, the outer susceptor section rests on a plurality of supports 160.

The drive shaft 130 enters the reaction chamber through an opening 132 in the bottom of the chamber, the walls of the chamber being continuous with a sleeve 134 that surrounds the drive shaft. The upper end of the drive shaft articulates with a support spider 120, located under the susceptor unit within the reactor chamber. The spider has a plurality of support elements, or arms 122, which radiate outward from a central hub 124. The distal ends of the arms 122 terminate in support posts or pegs 128 which fit within recessed seats 126 and 127 in the lower surfaces of the inner or outer susceptor sections, respectively (in this illustration, the spider is shown engaging the inner section 152). The articulation between the spider arms 122 and the recessed seats 126 provide a positive coupling means for effecting the rotational movement of the susceptor, and maintaining concentricity of the spider and susceptor during thermal expansions.

Surrounding the susceptor is a temperature compensation ring 159 supported on pegs 161 extending upwardly from a support ring 140 having legs 141 resting on the bottom wall 20 of the chamber. The ring 140 may be more clearly seen in FIG. 4, and it can be seen that the susceptor supports 160 are attached to the ring. A thermocouple 165 is shown within the ring 159 to sense the temperature of the ring and susceptor in that area.

FIG. 2 also schematically illustrates a robotic arm 188 joined by a connector 190 to an end effector 200 carrying a wafer 210. The robotic arm enters the reaction chamber from the access port 40 (located to the left). The top view of the reaction chamber shown in FIG. 3, illustrates another aspect of the relationship between the wafer 210, robotic arm end effector 200, the inner 152 and outer 154 susceptor sections and the support spider 120. As may be seen, the end effector 200 has a forked end that cradles the wafer on a pair of spaced support arms 202, extending beneath the periphery of the wafer and leaving between the arms, an open area which is sufficiently large to accommodate the inner susceptor section 152. Consequently, the inner susceptor section can travel vertically between the open arms 202 of the end effector, thereby picking up an unprocessed wafer and unloading a processed wafer. The free ends of the support arms define an open end, while the opposite ends are joined by a closed end portion 201. As seen, the arms are relatively narrow and extend adjacent the periphery of the wafer 210, as does the closed end 201. The rear of the arms 202 and the closed end 201 have a generally semi-circular inner edge, while the free ends of the arms diverge.

The end effector is relatively thin so that it can conveniently fit within a standard cassette to withdraw or replace a wafer from the cassette and can also fit beneath a wafer when a wafer is to be transferred from the susceptor.

The end effector is preferably formed with three pins or projections extending above the upper surface of the end effector to engage a wafer. A projection 203 is positioned on the outer or free end of each of the support arms, as seen in FIGS. 3 and 4. A third projection 205 is centrally positioned on the closed end of the end effector. All three of the projections are located so that they will engage the lower surface of a wafer close to the outer periphery of a wafer. It is desirable that only three projections engage the hot wafer when it is to be removed from the process chamber. Also, it is desirable that the projections engage the wafer near its outer periphery so that any effect of the end effector and the projections on the wafer is minimized. Preferably the pins are within 2 inches of the outer periphery of the wafer, more preferably within 1 inch, and most preferably within ½ inch of the wafer periphery and being in, or close to, the so-called exclusion zone at the periphery of a wafer, which may not be utilized in connection with an end product or device to be made from the wafer.

FIG. 3A illustrates a preferred form of the projections 203 and 205 where it can be seen a hole is formed through the end effector and a recessed area is formed in the end effector at the upper end of the hole. The projection is in the form of a pin having a shank portion 203*a* which is fused within the main portion of the hole in the end effector and having a head 203*b* which fits into the recess. In a prototype form of the product, the head is formed with a rounded upper surface on a circular radius of about ½ inch. However, the head only projects above the adjacent surface of the end effector about 0.010–0.020 of an inch. The end effector itself has a thickness of about 0.1 of an inch. The rounded upper surface of the pins minimizes the risk of scratching or otherwise marring the surface of a wafer, while it is engaging the wafer. Further, the upper surface is made very smooth to again minimize the risk of scratching the wafer. The end effector is preferably made of quartz or other suitable inert material capable of withstanding the high temperatures encountered in the process chamber. Quartz pins can be flame polished for smoothness.

Figure 10:
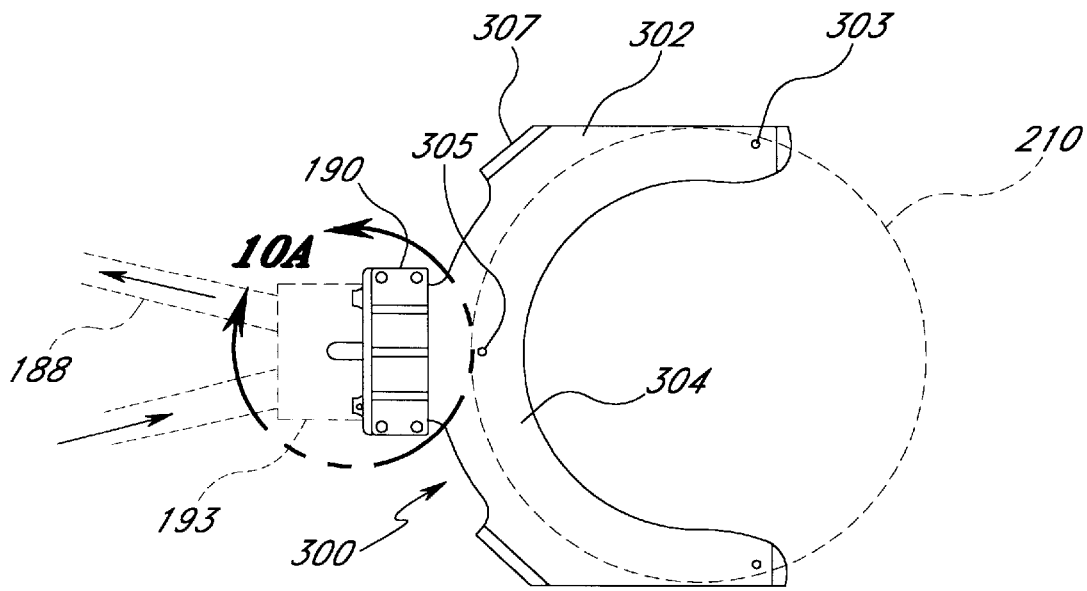
FIG. 10 is a plan view of an alternate form of an end effector.
Figure 10A:
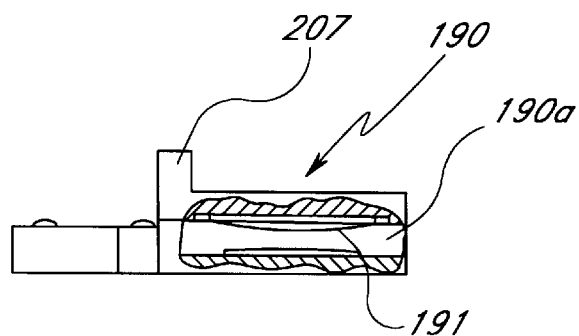
FIG. 10A is an enlarged side elevational, partially cross-sectional view of the end effector connector of FIG. 10.

Referring now to FIGS. 10 and 10A, there is illustrated another form of a forked end effector or paddle 300 and further detail of the connector 190 joining the end effector to a robotic arm 188. As can be seen, the paddle has a generally forked or U-shape with a pair of spaced support arms 302 defining an open end and being joined by a closed end portion 304. Each of the arms has a pin 303 which extends above the top surface of the paddle, and a third pin 305 is at the closed end of the paddle. The tips of the forked arms are beveled to a thinner edge to facilitate insertion of the paddle beneath a wafer in a cassette. The inner edge of the paddle 300 has a semi-circular shape with the forward edges diverging slightly as can be seen from the superimposed wafer 260, the paddle only extends beneath the outer portion of the wafer, and the pins engage the wafer adjacent the outer periphery of the wafer.

At the rear of each arm there is positioned an upwardly extending flange 307, the purpose of which is to push against a wafer that may have moved partially out of a cassette slot during handling of the cassette.

FIG. 10 shows the connector 190 attached to a rearwardly extending portion of the paddle 300. FIG. 10A shows a side elevational, partially sectionalized view of that connector. It includes a space 190*a* for receiving the rearwardly extending portion of the paddle. A pair of relatively flat spring elements 191 are positioned adjacent the upper and lower walls adjacent the space 190a to engage the rearwardly extending portion of the paddle in a resilient manner. A bracket 193 on the end of the robot arm 188, shown in broken lines in FIG. 10, is secured to the rear of the upwardly extending portion 207 of the connector 190. The bracket 193 and the connector 196 may be made of metal, and to help keep them cool, a coolant is conducted through one branch of the robot arm 188 through the bracket 193 and then returned in a second branch of the robot arm. Some cooling effect is also transferred to the connector 190 mounted on the paddle inasmuch as the connector and the bracket are in abutting relation. This also facilitates the hot-pickup of the wafer.

The relationship between the inner and outer susceptor sections is also illustrated in FIG. 3. The inner section 152 is shown surrounded by the annular outer section 154. Both the inner and outer sections have a plurality of circumferentially spaced, complementary, offsetting segments or tabs 162 and recesses 164, such that the tabs on the inner section fit snugly within the recesses in the outer section and visa versa. Consequently, the two susceptor sections fit together to form a substantially flat susceptor unit. Moreover, when the two susceptor sections are together, vertically disposed in the same plane, the interlocking tabs and recesses enable positive transfer of rotational torque, allowing the susceptor sections to rotate as a single unit. The outer susceptor supports 160 extend inwardly from the support ring 140. The supports 160 and 161 are shown in solid lines for ease of viewing, although they are hidden from above by the susceptor and the ring 159.

Although the support spider 120 is below the inner section 152, it is illustrated in solid lines in one position, and broken lines in its second position to facilitate understanding. The spider comprises a central hub 124 and a plurality of support elements, or arms 122. As can be appreciated from the illustration, rotation of the spider (in this case by 60 degrees), will cause the arms to selectively engage either the inner susceptor tabs 162 or the outer susceptor tabs 164.

Figure 4A:
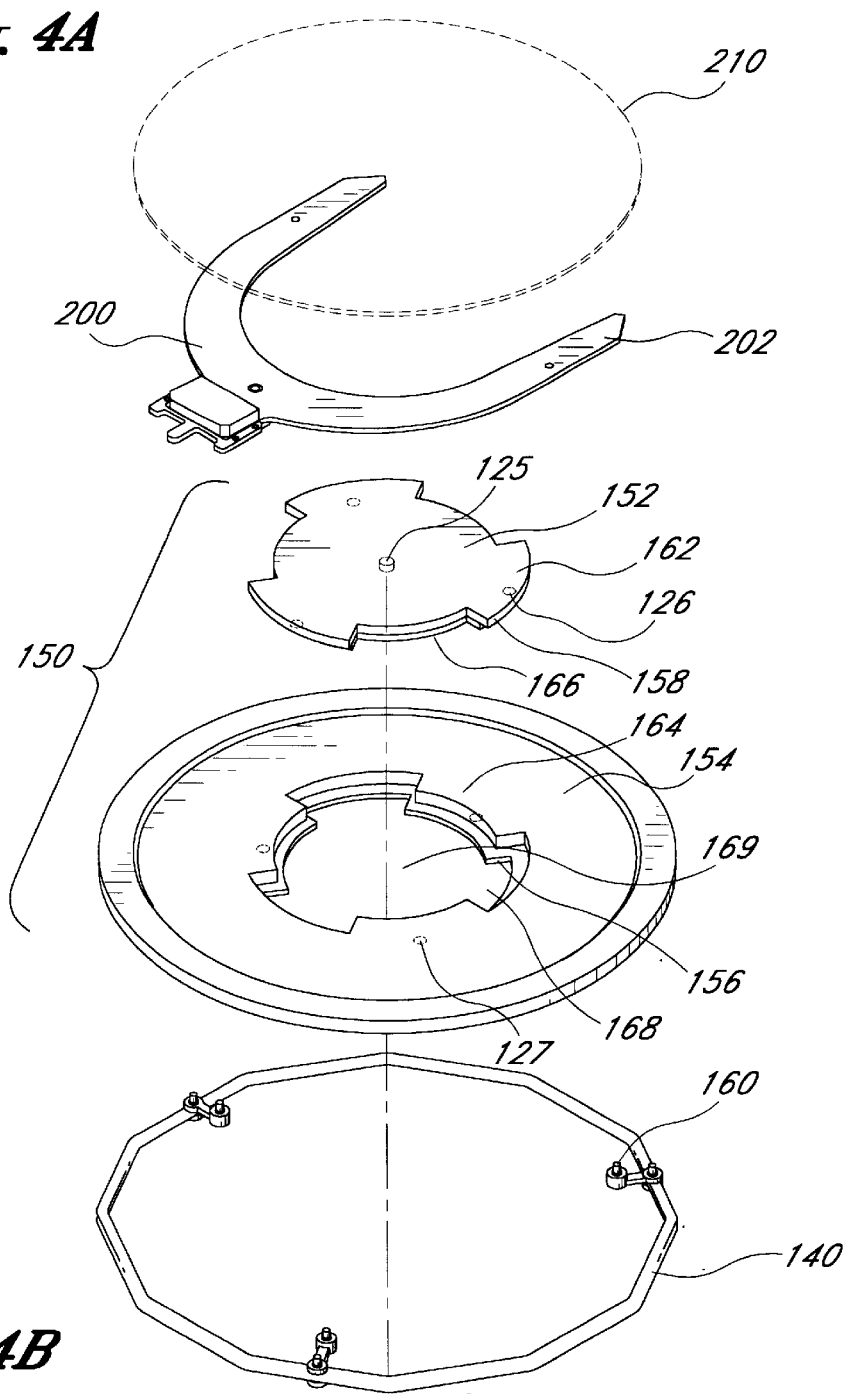
FIG. 4A is an exploded perspective view showing the arrangement of the support spider, the fixed support ring, the susceptor sections, the robotic arm end effector, and the wafer.

The exploded view in FIG. 4A is useful in illustrating the vertical relationships among the major components of the wafer transfer mechanism. The wafer 210 is supported by the robotic arm end effector 200, along the margin of the wafer by the arms 202 of the end effector. The inner susceptor section 152 tabs 162 may be seen extending radially outward from its outer margin. Between each tab 162 is a recess 166. On the lower surface of the inner section is a centrally disposed recess 125 which is adapted to accommodate the tip of a thermocouple 129 that extends through the shaft 130 and hub 124 of the support spider 120. The lower surface of each tab has a recessed seat 126 for receiving the support peg 128 on the distal end of each spider arm 122.

The annular outer susceptor section 154 tabs 164 may be seen extending radially inward from its inner margin into a central hole 169. Between each tab 164 is a recess 168. The tabs and recesses on the inner susceptor are complementary to those on the outer susceptor, so that an inner section tab 162 fits within an outer section recess 168 and an outer section tab 164 fits within an inner section recess 166, permitting the two susceptor sections to fit together. The inner section is vertically supported within the outer section by the offsetting flanges, 156 and 158. The overhanging flange 158 on the inner section rests on the under-extending flange 156 on the outer section. Note that the flanges extend both radially and circumferentially such that there is no light path through the susceptor. Also, the combined thickness of the flanges is equal to the thickness of the susceptor sections, thus, giving the entire susceptor the constant thickness in the area in which a wafer is placed.

The interface between the inner and outer sections, as seen from above, is in the shape of the periphery of the inner section 152, that is, extending circumferentially and radially. An arrangement to shorten the length of the interface is illustrated in FIG. 4C wherein an inner section 252 is shown as having a circular upper portion which fits within a corresponding circular recess 255 in an outer section 254. The diameter of the inner section 252 is the same as that for the section 152 in FIG. 4A, but the recesses 166 of section 152 are not formed in the upper portion of the alternative inner section 252. Recesses 266 are, however, formed in the lower portion of the inner section 252. Thus, the upper portions of section 252 that are above the recesses 266 are, in effect, flanges that fit onto corresponding flanges on the section 254. That is, as can be seen from FIG. 4C, the upper portion of the outer section 254 surrounding the central opening 269 is completely circular, while the lower portion of the outer section 254 is the same as in the lower portion of the outer section 154. Thus, section 254 includes three inwardly extending tabs or segments 264 that fit within the corresponding recesses 266 of the inner section 252. Similarly, segments 226 of the inner portion fit within the recesses 268 of the outer section. As noted above, the advantage of this arrangement is that the wafer faces a circular line between the two susceptors sections rather than the longer radially in and out line of the arrangement of FIG. 4A, and the gap can be made smaller.

The support spider 120 may be more clearly seen positioned on the end of the drive shaft 130. The thermocouple 129 extends through the center of the hub 124. The plurality of support elements, or arms 122, extend radially outward from the hub, each arm terminating in a support peg 128. The support pegs are adapted to fit within the recessed seats 126 and 127, in the inner and outer susceptor sections, respectively.

Operation

The operation of the system can be more clearly understood in reference to FIGS. 5–8. First, to load an unprocessed wafer into the reaction chamber, the robotic arm 190 enters the chamber via the access port 40 with the end effector 200 supporting the unprocessed wafer or substrate 210. The end effector and wafer are positioned directly above the susceptor unit 150. Then the inner susceptor section 152 is raised by the support spider 120. The inner susceptor section passes vertically between the open arms of the end effector, lifting the wafer 210 from the end effector as seen in FIG. 5. This highest position of the inner susceptor section 152 may be referred to as a "load/unload-etch" position. In this position, the robotic arm is withdrawn from the reaction chamber. The inner section 152 and the wafer are then lowered until the inner section comes to rest within the outer section 154; offsetting flanges on the inner and outer sections, respectively, cooperate to support the inner section within the outer section. The susceptor unit formed when the two susceptor sections come together is supported by the outer susceptor supports 160, attached to the support ring 140. As seen in FIG. 6, the susceptor unit is slightly below the wafer processing position.

Next, to process the wafer, the support spider must rotate to engage the outer susceptor section so it can raise the entire susceptor unit 150 together with the wafer into an elevated processing position. Specifically, once the spider 120 has traveled down to its lowest, "disengage/rotate" position, the support pegs 128 on the ends of the spider arms completely disengage from the recessed seats in the lower surface of the inner susceptor section. Then the spider 120 is free to rotate to a second position wherein the support pegs 128 are now situated directly below recessed seats in the lower surface of the outer susceptor section. As the spider is raised, it engages the outer section as shown in FIG. 6 and causes the susceptor unit 150 to rise. When the wafer is in an optimal, "processing" position for chemical vapor deposition, such that the upper surface of the wafer is in approximately the same plane as the upper surface of the temperature compensation ring 159, as shown in FIG. 7, the support spider stops traveling upward. During processing, the support spider causes the susceptor unit and wafer to rotate, thus facilitating more uniform deposition.

To unload the processed wafer 210 from the reaction chamber, the spider 120 is lowered. The susceptor unit and wafer travel downward until the outer susceptor section 154 comes to rest on the outer susceptor supports 160. Once again, the spider 120 continues lowering to the "disengage/rotate" position disengages from the susceptor unit. The spider then rotates back to its first position, in which the support pegs on the spider arms are again aligned directly below the recessed seats on the inner susceptor section 152. Now, the spider rises, lifting the inner susceptor, together with the wafer, out of the outer susceptor section, which remains resting on the outer susceptor supports. The inner section and wafer are raised to the highest, load/unload-etch position, which is high enough to permit the robotic arm end effector to enter the reaction chamber between the elevated inner susceptor section and the lower outer susceptor section; the arms of the end effector straddle the spider. Consequently, when the spider lowers, the inner susceptor section travels down between the forked arms of the end effector. As the inner section continues downward, the wafer, which substantially overhangs the inner section, comes to rest on the forked arms of the end effector. The robotic arm is then withdrawn, together with the processed wafer.

Finally, cleaning of the susceptor unit by chemical etching, can be accomplished between processing cycles at the highest, load/unload-etch vertical stop illustrated in FIG. 8. Gases known in the art, such as hydrogen chloride, may be used for etching. The raised position facilitates cleaning of both the upper and lower surfaces of the susceptor unit.

Various mechanisms may be employed for raising and lowering the susceptor.

Figure 9:
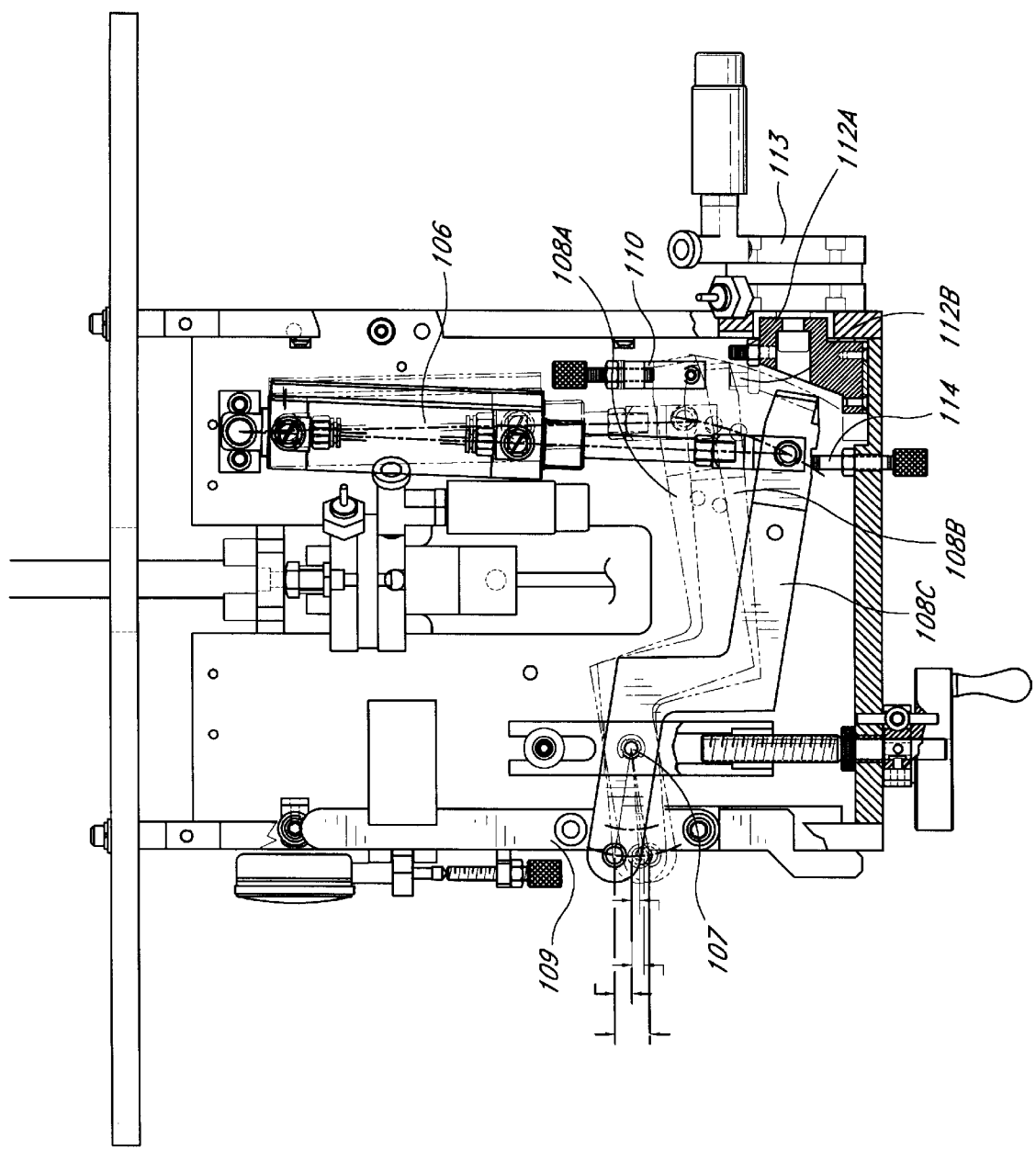
FIG. 9 is a cross-sectional view from the side of the lift assembly, showing the lever and vertical stops.

The lift assembly 100 illustrated in FIGS. 1 and 9 includes a lever 108 pivotally mounted on a pin 107. An actuator 106 attached to one end of the lever is operable for pivoting the lever 108, which in turn moves up and down a member 109, which is connected to the mounting plate 102. There are three adjustable stops for regulating the vertical movement of the lever. These correspond to the three vertical positions of the support spider (lower 108a, disengage/rotate; middle 108b, processing; and upper 108c, load/unload-etch). The lower position can be adjusted by adjusting the lower position stop 110. The middle, processing position stop 112 (shown in two positions) can be engaged or disengaged by operation of a pneumatic actuator 113. When the stop is withdrawn to the solid line position shown by 112a, the lever does not stop at this middle position, but travels freely between the upper and lower stops. In contrast, when the stop 112 moves to the phantom position shown by 112b, the lever is stopped in the middle position 108b. The upper, load/unload-etch position 108c is regulable by adjustment of stop 114. In addition to the elevator mechanism 100 for vertically moving the drive shaft, there is also provided any suitable drive for rotating the shaft 130.

Although the invention has been described in detail for the purpose of illustration, variations can be made by those skilled in the art without departing from the spirit and scope of the invention which is defined by the following claims. For example, when a portion of the susceptor is raised to load or unload a wafer, the vertical movement to transfer the wafer between the end effector and the susceptor can be provided by moving the end effector vertically, rather than the susceptor section. That is, when a susceptor section has been elevated to receive a wafer, the end effector could be lowered to transfer the wafer to the susceptor section. Similarly, when a wafer is to be unloaded from the susceptor, and the end effector is inserted beneath the wafer, the end effector could be raised to lift the wafer from the susceptor section.

Likewise, with the system in the process position, the relative vertical movement required to enable the spider to rotate relative to the susceptor unit could be provided by moving the outer supports 160 vertically rather than the spider. That is, once the susceptor is lowered to the disengage/rotate position comparable to that of FIG. 6, but with the spider still engaging the inner sections, the supports 160 could be elevated slightly to separate the susceptor unit from the spider and allow the spider rotate to the position where it can be moved to engage the inner section. Alternatively, a separate actuator could engage the outer section directly rather than through the supports 160.

Figure 4B:
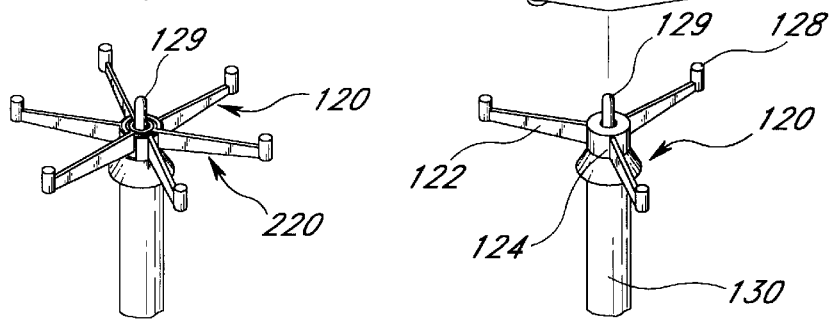
FIG. 4B is a perspective view of an alternate vertical lift arrangement.
Figure 4C:
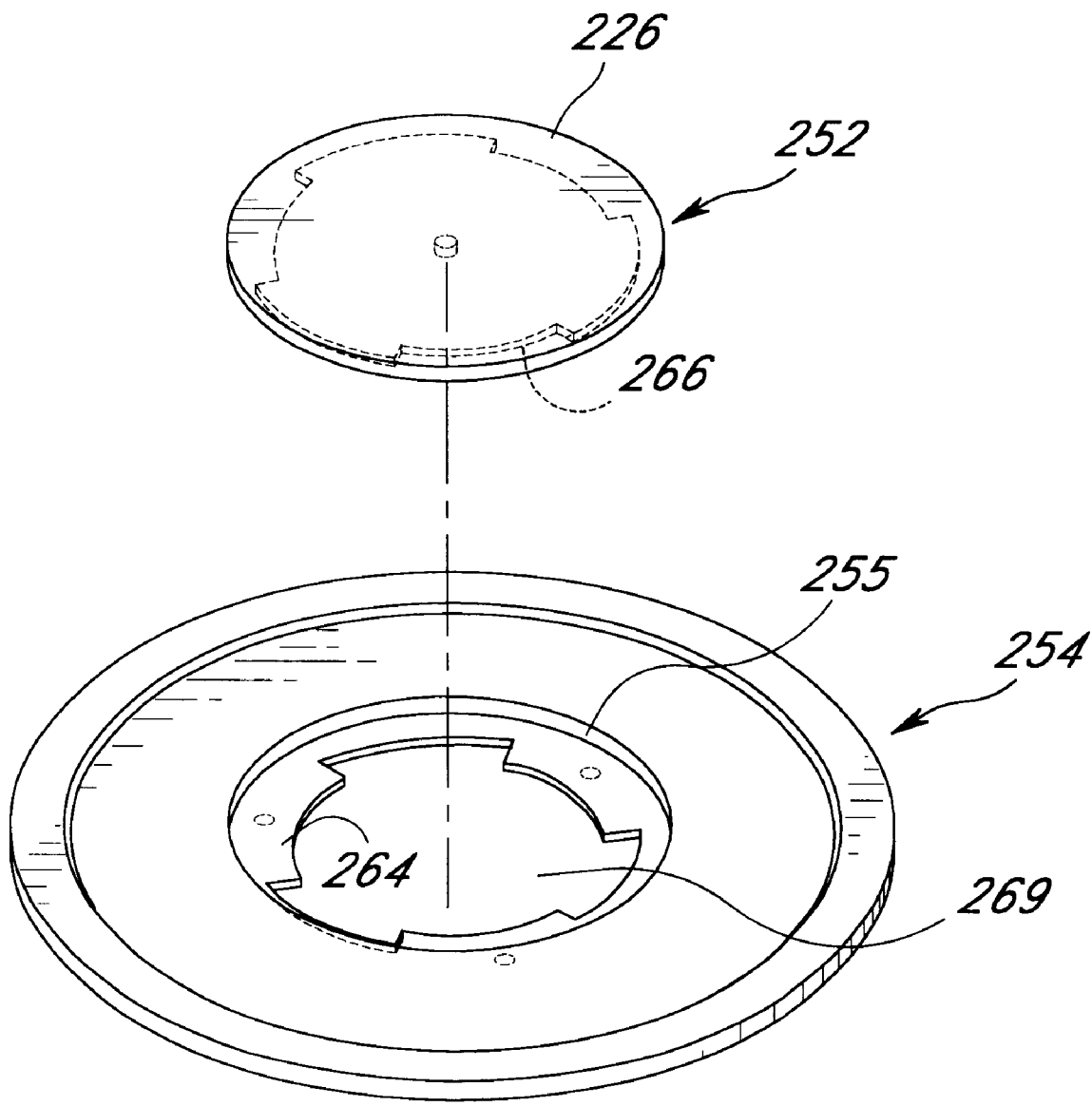
FIG. 4C is an exploded perspective view of an alternate configuration of the interface between the two susceptor sections.

In yet another arrangement shown schematically in FIG. 4B, the spider 120 can remain in contact with the outer section at all times, and a separate actuator spider 220, concentric and rotatable with the spider 120, can move vertically relative to the spider 120 to raise and lower the inner section to load and unload the wafer. With that arrangement, the supports 160 are not needed, and the need to index the spider 60° and to have the disengage/rotate position could be eliminated.

It should also be noted that various arrangements may be utilized to form the separable connection between the inner and outer susceptor sections. That is, configurations other than the lobed or segmented ones illustrated in FIGS. 4A and 4C may be utilized and fall within the scope of the invention.

One of the major advantages of the two-piece susceptor and the forked end effector is that wafers can be unloaded at an elevated temperature, in the range of about 700–1000° C. This allows increased throughput through the process chamber with an end effector that contacts the underside of a wafer. Heretofore, such hot pickup performance was only obtained with the above-mentioned Bernoulli wand system in which a wafer is lifted from above by gas flow creating a reduced pressure and a lifting effect substantially without contact of the wafer.

Prior systems in which a paddle is extended beneath the central portion of a wafer between pins that are supporting the wafer have typically only been lifting the wafer in the temperature range of 500–800° C. A probable reason for this is that if a wafer is lifted by pins at a higher temperature, the central portion of the wafer tends to temporarily warp or move somewhat as it is cooling. Thus, if the support pins are in this area, there is a tendency for the wafer to move with respect to the pins, which can cause scratching or marring of the wafer surface. Further, when an end effector is placed beneath the central portion of the wafer to transfer the wafer from the pins, there again may be a tendency for the wafer to move with respect to the paddle as the wafer is cooling, particularly because the paddle is cooler than the wafer. Consequently, the paddle may mar the wafer surface. As a consequence, such system for transferring wafers is typically conducted at the lower temperatures mentioned above.

This is in contrast to the present invention wherein the wafer is elevated by the relatively large inner section of the susceptor, and then transferred to a paddle which engages the outer periphery of the susceptor, while the susceptor inner section is lowered from the wafer. Since the central section of the susceptor is at the same temperature as the wafer and the inner section of the susceptor is relatively large with respect to the area of the wafer, there is no tendency for the wafer to move with respect to the inner section while the wafer is being elevated. After the inner section is withdrawn and the wafer is then being supported by the three pins on the paddle that engage the wafer adjacent its outer periphery, there is nothing contacting the central portion of the wafer that might mar the wafer as it flexes and cools. Further, if there is any relative movement between the wafer and the pins on the end effector, any marring of the wafer surface would be in or close to the exclusion zone on the wafer. Consequently, the system has been effective for transferring hot wafers about 900° C., thus increasing the productivity of the system.

The inner and outer sections of the susceptor fit relatively closely at the upper surface of the susceptor. Nevertheless, at the mating line between the two sections there is a slight line space where there is no contact between the susceptor and the substrate. To make sure that there is no temperature discontinuity in that area that could produce crystallographic slip or any variation in deposition thickness along that line, the temperature of the susceptor and the temperature of the wafer are kept the same during the deposition process. This is accomplished by properly controlling the heat provided by the radiant heat sources above and below the chamber walls as illustrated in FIG. 1. Further details of a suitable heating system are set forth in U.S. Pat. No. 4,836,138, which is incorporated herein by reference.

Referring to FIGS. 11–15, there is illustrated five additional variations of end effectors that share the common characteristic of enabling high temperature pickup of wafers while minimizing adverse nonuniform temperature effects on the wafer. FIGS. 11a and 11b illustrate an end effector having a substantially semicircular or U-shaped forward portion 402 supported in cantilever fashion by a stem 404 centrally connected to the forward portion and also connected to a bracket 406 adapted to be connected to a robotic arm in some suitable fashion. The forward portion 402 as well as the stem 404 are preferably formed of thin tubing made of quartz or other suitable material that can withstand high temperatures and does not contaminate the wafer 260 supported by the end effector. As can be seen, a support element 403 is positioned on the upper surface of the tips of the arc-shaped portion 402, and a third element 403 is positioned on the upper surface of the portion 402 at the intersection with the stem 404. Each support element 403 has a notch or step 403a on its radially inner side located and dimensioned to extend beneath to engage and support a wafer. Further, the upper portions of the elements 403 guide the positioning of the wafer on the end effector. As with the arrangement illustrated in FIG. 10, the end effector 402 only contacts a wafer at three peripheral portions, and the shape of the forward portion 402 as well as its spacing from the wafer minimizes any temperature effect on a wafer. Preferably, the surfaces on which the wafer rests are slightly sloped downwardly in a radially inwardly direction, as indicated in FIG. 11c. The slope is exaggerated in FIG. 11c for purposes of illustration. The end effector 402 can be used with the two piece susceptor described above and with a three pin wafer elevating system as described in the above-identified Perlov patent, which is incorporated herein by reference.

FIGS. 12a and 12b illustrate another end effector configuration preferably utilizing thin quartz tubing. As may be seen, a pair of tubes 502 extend in substantially parallel relation, with the rear ends being joined to a component 506 adapted to be connected to a robotic arm. The arms 502 are also joined by a cross piece 504 that provides support to the arms 502, allowing the forward portions 502a of those arms to extend in cantilever fashion. A support pin 503 is positioned on the free end of each arm portion 502a. A similar support pin 503 is centrally positioned on the cross piece 504. The elements 503 are analogous to the elements 403 in FIG. 11, each having a step 503a forming a surface for engaging the lower side of a wafer 260, as seen in FIG. 12b. As can be seen, a desirable three point support arrangement is provided, with two pins located at the forward edge of the wafer and the third centrally positioned on the cross piece.

The spacing of the forward portion 502a is such that those arms can straddle a central support and can fit between three spaced supports, such as that provided by the spider support described above. Further, the two-pronged paddle will also fit between three lifter pins of the type described in the above referenced Perlov patent. Such pins are schematically shown at 510 in FIG. 12a to illustrate the relationship with the paddle. While the prongs 502a extend beneath the wafer, they do not have a significant thermal effect on the wafer because they are spaced from the wafer and because they are formed of thin quartz tubing which is substantially transparent to most radiation.

Figure 13A:
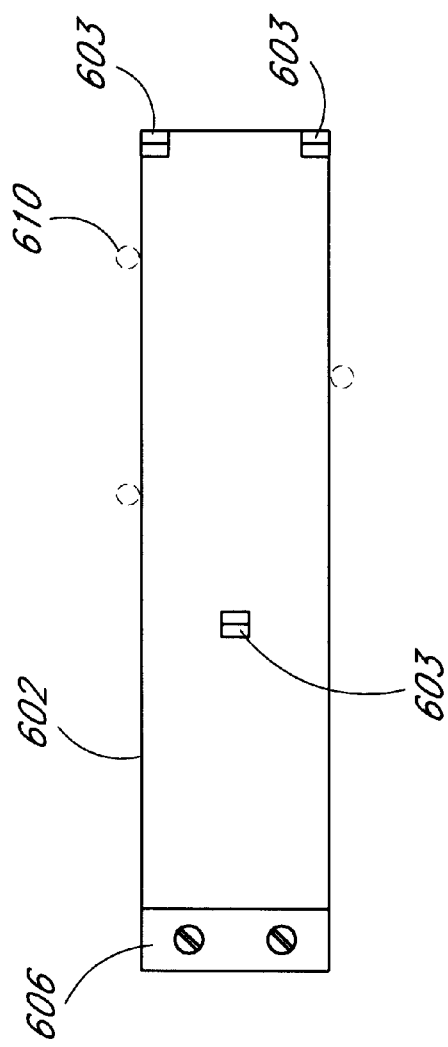
Figure 13B:
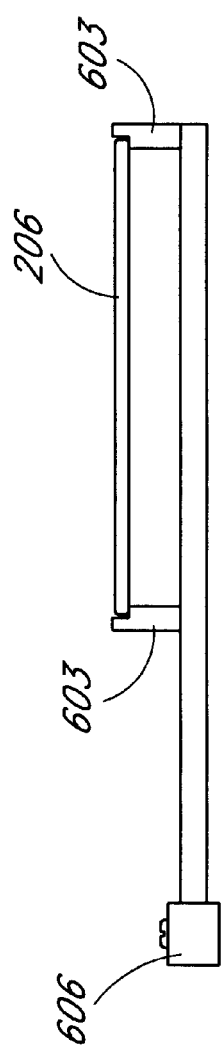

FIGS. 13a and 13b discloses a paddle type end effector constructed for use with a three pin type system for elevating a wafer above a susceptor. The paddle includes a generally rectangular plate 602 having its rear end supported by a bracket 606 adapted to be connected to a robotic arm. Two wafer support elements 603 are positioned on the forward corners of the plate 602, and a third is centrally positioned on the plate to cooperate with the rear edge of a wafer. As may be seen from FIGS. 13a and 13b, the three pins are located so as to provide three point support for a wafer 260. The pins 603 are taller than the pins used in the arrangements of FIGS. 11 and 12 so as to space the wafer above the plate 602. Preferably, the pins position a wafer at least about 2 millimeters above the paddle and more preferably at least about 5 millimeters. Thus, the wafer is only engaged at three points on its periphery, and the bulk of the paddle is spaced beneath the wafer so that the paddle has minimal nonuniformity thermal effect on the wafer, even though the paddle is only located in the central portion. The paddle is sized to fit between lifter pins 610.

FIGS. 14 and 15 utilize an alternate approach from the end effectors of FIGS. 11–13 in that instead of employing end effectors that have a minimum of thermal effect on the wafer so as to maintain temperature uniformity, the arrangements of FIGS. 14 and 15 provide greater thermal effect. However the thermal effect is relatively uniform such that adverse temperature non-uniformities are minimized.

The arrangement of FIG. 14a and 14b illustrates a large generally circular paddle forward portion 702 having a diameter slightly larger than the diameter of the wafer 260 to be supported on it. The circular portion is supported in cantilever fashion by a generally rectangular stem 704 connected to a bracket 706 to be joined to a robotic arm. The paddle includes a pair of spaced elongated slots 708 which create a three pronged paddle having a central section 702a between the slots 708, and a pair of side prongs 702b. The slots 708 are located so that three schematically indicated lifter pins 710 of a wafer elevating system, of the type disclosed in the above-mentioned Perlov patent, will fit within the slots with the pins properly oriented. That is, as shown, two of the lifter pins 710 will fit in one of the slots and one of the pins 710 will fit in the other slot. A pair of curved wafer support pins or elements 703 are located on the outer periphery of the two side prongs 702b. The support elements 703 include a slightly sloped step 703a on which the wafer 260 rests while the upper portions of the elements 703b laterally position the wafer. Alternatively, three pins may be located in a manner similar to that shown for the arrangement in FIG. 11. That is, the pins would be small as shown in FIG. 11 and would be spaced to provide the three point support. The paddle may be made of quartz, silicon carbide or other suitable material able to withstand high temperatures. Since the paddle, even with the slots 708, extends over more than about 80% of the area of the wafer 260, the paddle has a relatively uniform thermal effect on the wafer.

FIGS. 15a, 15b and 15c show an end effector comprising a forward circular disc 802 having a diameter slightly larger than a wafer 260 to be lifted. The disc 802 is supported in cantilever fashion by a generally rectangularly shaped stem 804 joined to the rear of the disc. As seen in FIGS. 15b and 15c, a pair of support elements 803 are depending from the lower surface on the lateral sides of the paddle 802. A third support element 803 is centrally located on the rear edge of the disc 802. Each element 803 includes a vertical portion 803a and a radially inwardly extending ledge or foot 803b, which form support for a peripheral portion of the wafer 260, as seen in FIG. 15b. The wafer is not shown in FIGS. 15a and 15c.

The end effector of FIG. 15 is useful with a susceptor wafer elevation system of the type disclosed in the present application or of the three lifter pin type referred to above. The disc 802 is intended to have a thermal effect on the wafer; however, since it extends over the entire upper surface of the wafer, the thermal effect is substantially uniform. The inwardly extending feet 803b that engage the wafer provide only three point support with minimal thermal effect.

It should be understood that certain aspects of the end effectors of FIG. 11–15 can be modified. For example, the support elements in the arrangement of FIG. 15 can be made circumferentially smaller consistent with the elements used in FIGS. 11–13. Further, various materials can be employed depending upon the characteristics and effects desired.

In use, a wafer 260 would be carried as shown in FIG. 15b. To transfer the wafer, the paddle would be moved over a wafer lifter, and slight relative vertical movement would transfer the wafer to the lifter. The paddle is then withdrawn. The reverse procedure is employed to transfer from the lifter to the paddle.

Also, one could combine the concepts of FIGS. 14 and 15 and construct an end effector which receives the wafer in a pocket. This is schematically shown in FIG. 16 with a lower slotted paddle 702, and an upper disc 802 joined by stepped wafer support elements 903. This structure will cool the wafer substantially uniformly from both sides during pickup with minimal warping.

What is claimed is:

1. An apparatus for supporting and handling a substrate in a substrate processing system, comprising:
   a forked end effector for transferring a thin, flat substrate to or from an inner section of a two-piece support unit, said end effector having a pair of spaced support arms joined by a closed end portion and defining an open end, said arms being spaced sufficiently to straddle the inner section and permit relative vertical movement between the end effector and said inner section, said arms being spaced less than a maximum side-to-side dimension of said substrate so that relative vertical movement of the inner section and said tool will transfer the substrate between the inner section and the tool support arms, said tool being formed to engage the lower surface of the outer portion of said substrate.

2. The apparatus of claim 1, wherein said tool has an upwardly extending projection near the tip of each of said arms and on the closed end portion, said projections being spaced to engage said substrate close to an outer edge of the substrate.

3. The apparatus of claim 2, wherein said projections extend above the upper surface of said tool a sufficient amount such that only said projections will engage the substrate when it is being sorted by the end effector.

4. The apparatus of claim 2, wherein said projections are located to engage the lower surface of said substrate in an annular band on the substrate between the edge of the substrate and less than two inches radially inwardly from the edge, but preferably less than one inch, but more preferably less than one half inch.

5. The apparatus of claim 2, wherein said projections have smoothly rounded polished upper surfaces.

6. The apparatus of claim 2, wherein said projections extend above the upper surface of the support arms about 0.010–0.080 inches.

7. The apparatus of claim 2, wherein said projections include surfaces to engage the substrate that are sloped in a manner to minimize contact with the substrate.

8. A method of transferring a substrate with respect to a susceptor in a chamber comprising the steps of:
   producing relative vertical movement between an inner susceptor section and an outer susceptor section so that the inner section is spaced above the outer section;
   moving a substrate with a forked tool into a position spaced above said susceptor with the tool engaging the lower surface of the substrate adjacent the outer periphery of substrate;
   providing relative vertical movement between said inner section and said outer section and between said inner section and said tool to engage the substrate with the inner section and transfer the substrate to the inner section, with portions of the substrate overlapping the inner section;
   withdrawing the tool; and
   producing relative vertical movement between said susceptor sections to cause the inner section to fit within and be supported by the outer susceptor section forming a susceptor unit for supporting said substrate.

9. The method of claim 8, further comprising:
   lowering a rotatable support for said inner section until it is disengaged from said inner section;
   rotating the support to a position wherein it is beneath said outer susceptor section; and
   raising said rotatable support to engage said outer susceptor section and lift the susceptor unit from a second support beneath said outer section and into a process position.

10. The method of claim 9, including:
    lowering said susceptor unit so that it rests solely upon the second support;
    lowering said rotatable support further and rotating it so that it is beneath said inner susceptor section;
    raising said inner susceptor section to lift said substrate above said outer susceptor section;

moving said tool between the susceptor sections;

producing relative vertical movement between the inner susceptor section and the tool to transfer the substrate to the tool; and withdrawing the tool horizontally to remove the substrate from vertical alignment with the susceptor unit.

11. An apparatus for processing semiconductor wafers comprising:

a process chamber;

a wafer support;

a robotic arm having an end effector mounted thereon for supporting a semiconductor wafer, the end effector being adapted to be inserted into and withdrawn from said chamber;

said end effector having a pair of spaced support arms which are joined at one end and adapted to be connected to said robotic arm, said end effector arms defining an open end, said end effector arms being spaced so that when inserted into said chamber, the arms are positioned to be vertically aligned with only peripheral portions of said wafer support so that structure for transferring a wafer to and from the wafer support will fit between the end effector arms, and so that the end effector arms will only engage the bottom surface of peripheral portions of a wafer.

12. The apparatus of claim 11, wherein said susceptor includes a central section and a surrounding annular section, said central section being movable vertically with respect to said outer section and with respect to said end effector.

13. The apparatus of claim 11, wherein said susceptor includes one or more portions to selectively project above the remainder of the susceptor to assist in transferring a wafer to and from the susceptor.

14. A method of transferring a substrate within a chamber, comprising the steps of:

producing relative vertical movement between a substrate and an outer susceptor section to position said substrate on support structure spaced above the outer section;

inserting a forked end effector spaced beneath the substrate and above the outer section, the end effector having support arms which are spaced sufficiently to straddle said support structure; and producing relative vertical movement between the support structure and the end effector to cause the substrate to be transferred to a plurality of end effector projections engaging said substrate only adjacent its outer edge.

15. The method of claim 14, wherein said substrate is transferred to said end effector while the substrate is at a temperature above 600° C.

16. The method of claim 14, wherein the substrate is transferred to the end effector while the substrate temperature is above 700° C.

17. The method of claim 14, wherein the substrate is transferred to the end effector when the substrate temperates above 800° C.

18. The method of claim 14, wherein the substrate is transferred to the end effector when the substrate, temperature is about 900° C.

19. A method of transferring a thin, flat substrate to a susceptor comprising the steps of:

inserting a forked end effector into a chamber above a susceptor with said substrate supported on the end effector, said end effector having a pair of spaced support arms joined at one end and having free ends defining an open end, said arms engaging the lower surface of said substrate adjacent an outer edge of the substrate;

vertically separating the substrate from the end effector;

withdrawing the end effector from the chamber; and transferring the substrate to the susceptor.

20. The method of claim 19, including the steps of:

processing the substrate;

vertically separating the substrate from at least a peripheral portion of the susceptor;

inserting the end effector arms beneath but spaced from the substrate adjacent the outer edge of the substrate;

producing relative vertical movement between the substrate and the end effector to cause the end effector to engage the lower surface of the substrate adjacent its outer edge and to support the substrate.

21. A method of transferring a thin, flat substrate comprising the steps of:

positioning said substrate on a forked end effector having a pair of spaced support arms joined at one end and having free ends defining an open end, said end effector being configured to only engage the lower surface of said substrate adjacent an outer edge of the substrate;

inserting the end effector and the substrate into a chamber above the susceptor; and transferring the substrate to structure which fits within the arms of the end effector by producing relative vertical movement between the end effector and said structure.

22. The method of claim 21, wherein said positioning step includes positioning the substrate on three projections extending upwardly from the end effector.

23. The method of claim 22, wherein one of said projections is positioned near the tip of one of said support arms, another of said projections is positioned near the tip of the other support arm, and the third projection is positioned at a closed end of the end effector.

24. A method of processing a thin, flat substrate comprising:

positioning a substrate on a susceptor in a process chamber, said susceptor having an inner section and a surrounding annular section with a mating line between the sections on the upper surface of the susceptor; and heating said susceptor and substrate in a manner to keep the temperature of the substrate and the susceptor substantially the same while depositing a layer on the substrate so that there is no crystallographic slip in said substrate at said line and there is no substantial difference in the thickness of said layer at said line and the areas of said substrate adjacent said line.

25. The method of claim 24, wherein said heating step is performed by heating the substrate and the susceptor from a heat source spaced above the substrate and heating said substrate and said susceptor from a heat source spaced below said substrate.

26. The method of claim 25, wherein said susceptor and substrate are positioned within a chamber having quartz upper and lower walls spaced above and below the susceptor and said heating step is provided by a heat source positioned above said upper wall and a heat source positioned below said lower wall.

27. The method of claim 24, including supporting said substrate with spaced support elements that engage support portions of said annular section that extend beneath portions of said inner section to support the inner section, and with said mating line being positioned radially outwardly from said support elements.

28. The method of claim 27, wherein said mating line is circular.

29. An apparatus for supporting and handling a substrate in a substrate processing system comprising:
   an end effector including a frame formed of thin-walled tubing which can withstand chemical vapor deposition temperatures; and
   a plurality of support elements mounted on said frame and configured to engage the periphery of a substrate at spaced locations to support the substrate and space the substrate from the tubing while having a minimal thermal effect on the substrate.

30. The apparatus of claim 29, wherein said frame includes a pair of spaced arms joined by a closed end portion and defining an open end, said arms being spaced sufficiently to straddle a substrate lifter adapted to lift the substrate above a susceptor, and said arms being spaced to permit relative vertical movement between the end effector and said lifter, said arms being spaced less than a maximum side-to-side dimension of said substrate so that relative vertical movement of the lifter and said end effector will transfer the substrate between the lifter and the support arms, one of said elements being located on a tip of each of said arms.

31. At The apparatus of claim 30, wherein a third one of said elements is centrally located on said closed end portion.

32. The apparatus of claim 29, wherein said tubing is made of quartz.

33. The apparatus of claim 29, wherein said frame includes a pair of generally straight, spaced tubes, and a cross-piece extending between and connected to said pair of support tubes, said tubes include an element positioned on a free end of each of said tubes and a support element positioned on said cross-piece, said elements being spaced from each other to define a three point support to engage the undersurface of the periphery of said substrate, said support arms having a minimal thermal effect on said substrate.

34. The apparatus of claim 33, wherein said tubes extend rearwardly from said cross-piece and are connected to a bracket for a connection to a robotic arm.

35. An apparatus for supporting and handling a substrate in a substrate processing system comprising a paddle and a plurality of support elements mounted to the paddle and extending above the paddle, said elements being configured to engage and support the periphery of a substrate, said elements being sufficiently tall to space the substrate above the paddle a sufficient distance to prevent the paddle from having any substantial thermal effect on aid substrate.

36. The apparatus of claim 35, wherein said paddle is generally rectangular.

37. The apparatus of claim 35, wherein said elements space the substrate at least about 2 millimeters above the upper surface of the paddle.

38. An apparatus for supporting and handling a substrate in a substrate processing system comprising an end effector to be mounted on a robotic arm, said end effector including a support that extends generally parallel to a substrate to be carried by the end effector, and a plurality of support elements attached to said support configured to engage the periphery of the substrate at spaced locations and to hold the substrate closely spaced and substantially parallel to said support, said support having an area adjacent the substrate which is at least about 80% that of the substrate so that any thermal effect on the substrate caused by said support is substantially uniform.

39. The apparatus of claim 38, wherein said support is a generally circular disk and said support elements are attached to the periphery of the disc, said disc having one or more slots opening to a forward end of the disc and extending rearwardly, said one or more slots being configured to receive lifter pins for lifting a substrate above a susceptor to facilitate the transfer of the substrate between the pins and the end effector.

40. The apparatus of claim 39, wherein said one or more slots include a pair of spaced slots that divide said disc into a central prong and a pair of side prongs, said slots being spaced so as to receive a pair of lifter pins in one slot and a third pin in the other slot.

41. The apparatus of claim 39, including an upper disc supported above the slotted disc sufficiently to be spaced above the substrate.

42. The apparatus of claim 41, wherein said upper disc is supported by upper ends of said support elements.

43. The apparatus of claim 38, wherein said support comprises a substantially circular disc, said support elements being attached to the lower peripheral portion of said disc and having inwardly extending ledges spaced beneath said disc and adapted to receive peripheral portions of a substrate whereby the substrate is carried beneath and slightly spaced below, said disc.

44. The apparatus of claim 43, wherein said disc has a diameter slightly greater than the substrate to be supported by the end effector.

* * * * *